United States Patent
Ge et al.

(10) Patent No.: US 8,327,526 B2
(45) Date of Patent: Dec. 11, 2012

(54) ISOLATED ACTIVE TEMPERATURE REGULATOR FOR VACUUM PACKAGING OF A DISC RESONATOR GYROSCOPE

(75) Inventors: Howard H. Ge, Alhambra, CA (US); A. Dorian Challoner, Manhattan Beach, CA (US)

(73) Assignee: The Boeing Company, Chicago, IL (US)

( * ) Notice: Subject to any disclaimer, the term of this patent is extended or adjusted under 35 U.S.C. 154(b) by 593 days.

(21) Appl. No.: 12/473,084

(22) Filed: May 27, 2009

(65) Prior Publication Data

US 2010/0300201 A1     Dec. 2, 2010

(51) Int. Cl.
*H05B 3/00* (2006.01)

(52) U.S. Cl. ............. 29/611; 29/595; 29/602.1; 29/622; 73/497; 73/504.12; 73/504.13; 73/504.14

(58) Field of Classification Search ............ 29/611, 29/592.1, 594, 595, 602.1, 609.1, 622; 73/493, 73/497, 504.12, 504.13, 504.14; 216/20, 216/33, 65; 257/678, E21.502
See application file for complete search history.

(56) References Cited

U.S. PATENT DOCUMENTS

| | | | |
|---|---|---|---|
| 392,650 | A | 11/1888 | Watrous |
| 4,898,031 | A | 2/1990 | Oikawa et al. |
| 5,203,208 | A | 4/1993 | Bernstein |
| 5,226,321 | A | 7/1993 | Varnham et al. |
| 5,345,822 | A * | 9/1994 | Nakamura et al. ......... 73/504.14 |
| 5,421,312 | A | 6/1995 | Dawson |
| 5,578,976 | A | 11/1996 | Yao et al. |
| 5,646,346 | A | 7/1997 | Okada |
| 5,665,915 | A | 9/1997 | Kobayashi et al. |
| 5,728,936 | A | 3/1998 | Lutz |
| 5,783,749 | A | 7/1998 | Lee et al. |
| 5,894,090 | A | 4/1999 | Tang et al. |
| 5,905,202 | A | 5/1999 | Kubena et al. |
| 5,920,012 | A | 7/1999 | Pinson |
| 5,987,985 | A | 11/1999 | Okada |
| 6,009,751 | A | 1/2000 | Ljung |

(Continued)

FOREIGN PATENT DOCUMENTS

DE    44 42 033 A1    5/1996

(Continued)

OTHER PUBLICATIONS

Wright et al., "The HRG Applied to a Satellite Attitude Reference System," Guidance and Control, AASAAS, 1994, 86:1-13.

(Continued)

*Primary Examiner* — Thiem Phan
(74) *Attorney, Agent, or Firm* — Canady & Lortz LLP; Bradley K. Lortz

(57) ABSTRACT

A micromachined thermal and mechanical isolator for MEMS die that may include two layers, a first layer with an active temperature regulator comprising a built-in heater and temperature sensor and a second layer having mechanical isolation beams supporting the die. The isolator may be inserted between a MEMS die of a disc resonator gyroscope (DRG) chip and the leadless chip carrier (LCC) package to isolate the die from stress and temperature gradients. Thermal and mechanical stress to the DRG can be significantly reduced in addition to mitigating temperature sensitivity of the DRG chip. The small form can drastically reduce cost and power consumption of the MEMS inertial sensor and enable new applications such as smart munitions, compact and integrated space navigation solutions, with significant potential cost savings over the existing inertial systems.

28 Claims, 17 Drawing Sheets

U.S. PATENT DOCUMENTS

| | | | |
|---|---|---|---|
| 6,044,705 | A | 4/2000 | Neukermans et al. |
| 6,094,984 | A | 8/2000 | Asano et al. |
| 6,145,380 | A | 11/2000 | Macgugan |
| 6,151,964 | A | 11/2000 | Nakajima |
| 6,164,134 | A | 12/2000 | Cargille |
| 6,182,352 | B1 | 2/2001 | Deschenes et al. |
| 6,263,552 | B1 | 7/2001 | Takeuchi et al. |
| 6,282,958 | B1 | 9/2001 | Fell et al. |
| 6,289,733 | B1 | 9/2001 | Challoner et al. |
| 6,360,601 | B1 | 3/2002 | Challoner et al. |
| 6,367,786 | B1 | 4/2002 | Gutierrez et al. |
| 6,481,284 | B2 | 11/2002 | Geen et al. |
| 6,481,285 | B1 | 11/2002 | Shkel et al. |
| 6,515,278 | B2 | 2/2003 | Wine et al. |
| 6,629,460 | B2 | 10/2003 | Challoner |
| 6,944,931 | B2 | 9/2005 | Shcheglov et al. |
| 7,040,163 | B2 | 5/2006 | Shcheglov et al. |
| 7,168,318 | B2 | 1/2007 | Challoner et al. |
| 7,401,397 | B2 | 7/2008 | Shcheglov et al. |
| 7,679,171 | B2 * | 3/2010 | Anderson et al. ............. 257/678 |
| 2002/0066317 | A1 | 6/2002 | Lin |
| 2003/0010123 | A1 | 1/2003 | Malvern et al. |
| 2003/0029238 | A1 | 2/2003 | Challoner |
| 2004/0055380 | A1 | 3/2004 | Shcheglov et al. |
| 2005/0017329 | A1 | 1/2005 | Hayworth et al. |
| 2005/0274183 | A1 | 12/2005 | Shcheglov et al. |
| 2006/0162146 | A1 | 7/2006 | Shcheglov et al. |
| 2007/0084042 | A1 | 4/2007 | Challoner et al. |
| 2008/0295622 | A1 | 12/2008 | Challoner |

FOREIGN PATENT DOCUMENTS

| | | |
|---|---|---|
| DE | 19719601 A1 | 11/1998 |
| EP | 0 461 761 A1 | 12/1991 |
| EP | 1055908 A1 | 11/2000 |
| EP | 0 971 208 A2 | 12/2000 |
| JP | 01129517 A | 5/1989 |
| WO | WO 98/15799 | 4/1998 |
| WO | WO 96/38710 | 12/1998 |
| WO | WO 00/68640 | 11/2000 |
| WO | WO 01/44823 A | 6/2001 |
| WO | WO 01/74708 A | 10/2001 |

OTHER PUBLICATIONS

Putty et al., "A Micromachined Vibrating Ring Gyroscope," Solid State Sensor and Actuator Workshop, Transducer Research Foundation, Hilton Head, 1994, pp. 213-220.

Tang et al., "A Packaged Silicon MEMS Vibratory Gyroscope for Microspacecraft," Proceedings IEEE, 10th Annual Int. Workshop on MEMS, Japan, 1997, pp. 500-505.

Barbour et al., "Micromechanical Silicon Instrument and Systems Development at Draper Laboratory," AIAA Guidance Navigation and Control Conference, 1996, Paper No. 96-3709.

Johnson et al., "Surface Micromachined Angular Rate Sensor," A1995 SAE Conference, Paper No. 950538, pp. 77-83.

Fujita et al., "Disk-shaped bulk micromachined gyroscope with vacuum sealing," Sensors and Actuators A:Physical, vol. 82, May 2000, pp. 198-204.

Skulski et al., "Planar resonator sensor for moisture measurements", Microwaves and Radar, 1998, MIKON '98, 12th International Conf., vol. 3, May 20-22, 1998, pp. 692-695.

Pryputniewicz et al., "New Approach to Development of Packaging for MEMS inertial Sensors," Proceedings of 2001 ASME Int. Mech. Eng. Cong. and Expo., Nov. 11-16, 2001, NY.

* cited by examiner

ISOLATED ACTIVE TEMPERATURE REGULATOR FOR VACUUM PACKAGING OF A DISC RESONATOR GYROSCOPE

CROSS-REFERENCE TO RELATED APPLICATIONS

This application is related to the following co-pending applications, which are all incorporated by reference herein:

U.S. patent application Ser. No. 12/416,911, filed Apr. 1, 2009, and entitled "ENVIRONMENTALLY ROBUST DISC RESONATOR GYROSCOPE", by Ge et al.;

U.S. patent application Ser. No. 12/416,894, filed Apr. 1, 2009, and entitled "THERMAL MECHANICAL ISOLATOR FOR VACUUM PACKAGING OF A DISC RESONATOR GYROSCOPE", by Ge et al.;

U.S. patent application Ser. No. 11/458,911 (Application Publication No. US 2007 0017287 A1), filed Jul. 20, 2006, and entitled "DISC RESONATOR GYROSCOPES", by Kubena et al.;

U.S. patent application Ser. No. 11/757,395 (Application Publication No. 2008-0295622A1), filed Jun. 4, 2007, and entitled "PLANAR RESONATOR GYROSCOPE WITH CENTRAL DIE ATTACHMENT", by Challoner; and U.S. patent application Ser. No. 11/831,822, filed Jul. 31, 2007, and entitled "DISC RESONATOR INTEGRAL INERTIAL MEASUREMENT UNIT", by Challoner et al.

BACKGROUND OF THE INVENTION

1. Field of the Disclosure

The present disclosure relates to gyroscopes, and in particular to manufacturing disc resonator gyroscopes. More particularly, this invention relates to manufacturing disc resonator gyroscopes with an isolating case.

2. Description of the Related Art

Mechanical gyroscopes are used to determine direction of a moving platform based upon the sensed inertial reaction of an internally moving proof mass. A typical electromechanical gyroscope comprises a suspended proof mass, gyroscope case, pickoffs, or sensors, torquers, or actuators and readout electronics. The inertial proof mass is internally suspended from the gyroscope case that is rigidly mounted to the platform and communicates the inertial motion of the platform while otherwise isolating the proof mass from external disturbances. The pickoffs to sense the internal motion of the proof mass, the torquers to maintain or adjust this motion and the readout electronics that must be in close proximity to the proof mass are internally mounted to the case which also provides the electrical feedthrough connections to the platform electronics and power supply. The case also provides a standard mechanical interface to attach and align the gyroscope with the vehicle platform. In various forms gyroscopes are often employed as a critical sensor for vehicles such as aircraft and spacecraft. They are generally useful for navigation or whenever it is necessary to autonomously determine the orientation of a free object.

Older conventional mechanical gyroscopes were very heavy mechanisms by current standards, employing relatively large spinning masses. A number of recent technologies have brought new forms of gyroscopes, including optical gyroscopes such as laser gyroscopes and fiberoptic gyroscopes as well as mechanical vibratory gyroscopes.

Spacecraft generally depend on inertial rate sensing equipment to supplement attitude control. Currently this is often performed with expensive conventional spinning mass gyros (e.g., a Kearfott inertial reference unit) or conventionally-machined vibratory gyroscopes (e.g. a Litton hemispherical resonator gyroscope inertial reference unit). However, both of these are very expensive, large and heavy.

In addition, although some prior symmetric vibratory gyroscopes have been produced, their vibratory momentum is transferred through the case directly to the vehicle platform. This transfer or coupling admits external disturbances and energy loss indistinguishable from inertial rate input and hence leads to sensing errors and drift. One example of such a vibratory gyroscope may be found in U.S. Pat. No. 5,894,090 to Tang et al. which describes a symmetric cloverleaf vibratory gyroscope design and is hereby incorporated by reference herein. Other planar tuning fork gyroscopes may achieve a degree of isolation of the vibration from the baseplate, however these gyroscopes lack the vibrational symmetry desirable for tuned operation.

In addition, shell mode gyroscopes, such as the hemispherical resonator gyroscope and the vibrating thin ring gyroscope, are known to have some desirable isolation and vibrational symmetry attributes. However, these designs are not suitable for or have significant limitations with thin planar silicon microfabrication. The hemispherical resonator employs the extensive cylindrical sides of the hemisphere for sensitive electrostatic sensors and effective actuators. However its high aspect ratio and 3D curved geometry is unsuitable for inexpensive thin planar silicon microfabrication. The thin ring gyroscope (e.g., U.S. Pat. No. 6,282,958, which is incorporated by reference herein) while suitable for planar silicon microfabrication, lacks electrostatic sensors and actuators that take advantage of the extensive planar area of the device. Moreover, the case for this gyroscope is not of the same material as the resonator proof mass so that the alignment of the pickoffs and torquers relative to the resonator proof mass change with temperature, resulting in gyroscope drift.

Vibration isolation using a low-frequency seismic support of the case or of the resonator, internal to the case is also known (e.g., U.S. Pat. No. 6,009,751, which is incorporated by reference herein). However such increased isolation comes at the expense of proportionately heavier seismic mass and/or lower support frequency. Both effects are undesirable for compact tactical inertial measurement unit (IMU) applications because of proof mass misalignment under acceleration conditions.

More recently, a novel resonator structure comprising a disc using embedded electrostatic electrodes for excitation and sensing has been developed for microgyro applications. In general, the electrodes are formed along with the resonator by through etching a wafer selectively bonded to a baseplate such that the through-etched sidewalls form the capacitive gaps between the electrodes and the resonator and the electrodes and the resonator remain separately bonded to the baseplate. Three-dimensional vibration modes of the disc are excited and sensed to measure angular rate. Some development of such disc resonator gyroscopes (DRG) and applications has already occurred.

However, there is need for improvement of disc resonator gyroscopes (DRG) implementations. For example, coefficient of thermal expansion (CTE) mismatch between the DRG die and the leadless chip carrier (LCC) package can cause temperature sensitivity in existing designs. In addition, residual stress in the device can cause unstable sensor dynamics over time. Furthermore, rigid attachment between DRG die and LCC package can easily transmit stress and vibration, rendering the device too sensitive to ambient conditions. Finally, the proximity of the large bond area to the active sensor element can further impair stress and temperature sensitivity in existing DRG designs.

In view of the foregoing, there is a need in the art for techniques applied to DRGs to make them operate with reduced temperature sensitivity. There is particular need for such techniques for DRGs in space applications. Further, there is a need for such DRGs to be produced with an integral vacuum case. In addition, there is a need for such DRGs with equal or better performance than comparable resonator gyroscopes. As detailed below, the present invention satisfies all these and other needs.

SUMMARY OF THE INVENTION

A micromachined thermal and mechanical isolator for a MEMS die that may include two layers, a first layer with an active temperature regulator comprising a built-in heater and temperature sensor and a second layer having mechanical isolation beams supporting the die. The isolator may be inserted between a MEMS die of a disc resonator gyroscope (DRG) chip and the leadless chip carrier (LCC) package to isolate the die from stress and temperature gradients. Thermal and mechanical stress to the DRG can be significantly reduced in addition to mitigating temperature sensitivity of the DRG chip. The small form can drastically reduce cost and power consumption of the MEMS inertial sensor and enable new applications such as smart munitions, compact and integrated space navigation solutions, with significant potential cost savings over the existing inertial systems.

A typical embodiment comprises an apparatus for isolating a MEMS die, including a top layer comprising a resistive heater for regulating temperature of the MEMS die, and a bottom layer comprising a bottom layer central region, one or more bottom layer periphery regions and a plurality of substantially radial bottom layer isolation beams, each extending from the bottom layer central region to one of the one or more bottom layer periphery regions. An upper surface of the top layer is bonded to the MEMS die and a lower surface of the top layer is bonded to the bottom layer and a temperature sensor is used with the resistive heater to regulate the temperature of the MEMS die. Each of the plurality of substantially radial bottom layer isolation beams may comprise a plurality of circumferential segments and radial segments connected in series. In addition, the top layer and the bottom layer may comprise a semiconductor material selected from the group consisting of oxidized silicon and fused silica.

In some embodiments, temperature regulation may be achieved by referencing a clock signal with very stable frequency characteristics. The temperature sensor operates from a frequency difference between a stable clock frequency and a resonant frequency of the MEMS die and regulating the temperature of the MEMS die is performed by operating the resistive heater such that the frequency difference is maintained at a substantially constant value.

In some embodiments, the top layer and the bottom layer are bonded at one or more top layer periphery regions and the one or more bottom layer periphery regions. The one or more bottom layer periphery regions may comprise a bottom layer outer frame. Furthermore, the lower surface of the top layer may be bonded to the bottom layer outer frame.

In further embodiments, the top layer further comprises a top layer central region, one or more top layer periphery regions, and a plurality of substantially radial top layer isolation beams, each extending from the top layer central region to one of the one or more top layer periphery regions. The lower surface of the top layer may be bonded at the top layer central region to the bottom layer central region. Similar to the bottom layer, each of the plurality of substantially radial top layer isolation beams may comprise a plurality of circumferential segments and radial segments connected in series.

In some embodiments, the MEMS die comprises a disc resonator having embedded electrostatic electrodes having sidewalls that interact with interior sidewalls of the disc resonator such that vibration modes of the disc resonator are driven and sensed with the embedded electrostatic electrodes to measure motion of the disc resonator, and a baseplate having a topside bonded to support the disc resonator and having electrical traces coupled from the embedded electrostatic electrodes and to a baseplate periphery. The baseplate is bonded to the upper surface of the top layer. In addition, the bottom layer may be bonded to a bottom interior of a vacuum package comprising electrical feedthroughs where the electrical feedthroughs are coupled to wire bonds which are coupled in turn to the electrical traces at the baseplate periphery. The vacuum package may comprise a lid including a getter material activated to assist in producing a vacuum within the vacuum package, and the lid is bonded to close out the vacuum package.

Similarly, a typical method embodiment of producing an isolator for a MEMS die comprises producing a top layer comprising a resistive heater for regulating temperature of the MEMS die, etching a bottom layer comprising a bottom layer central region, one or more bottom layer periphery regions and a plurality of substantially radial bottom layer isolation beams, each extending from the bottom layer central region to one of the one or more bottom layer periphery regions, bonding a lower surface of the top layer to the bottom layer, and bonding an upper surface of the top layer to the MEMS die. A temperature sensor is used with the resistive heater to regulate the temperature of the MEMS die. Method embodiments of the disclosure may be further modified consistent with the apparatus embodiments described herein.

In yet another embodiment, an apparatus for isolating a MEMS die comprises a top layer comprising a temperature isolation means for substantially actively regulating a temperature of the MEMS die, and a bottom layer comprising mechanical isolation means for substantially isolating vibration of the MEMS die. An upper surface of the top layer is bonded to the MEMS die and a lower surface of the top layer is bonded to the bottom layer. This embodiment of the disclosure may be further modified consistent with other apparatus and method embodiments described herein.

BRIEF DESCRIPTION OF THE DRAWINGS

Referring now to the drawings in which like reference numbers represent corresponding parts throughout.

DETAILED DESCRIPTION OF THE PREFERRED EMBODIMENT

1. Overview

An isolator that may include an active temperature regulator has been conceived to overcome the deficiencies described above. Embodiments of the disclosure can be readily inserted into an existing disc resonator gyroscope (DRG) leadless chip carrier (LCC) package assembly without disrupting any of the existing manufacturing process flow or design. In this case, the isolator may be inserted between the die and the LCC bottom to replace the large bond pads of the existing design (e.g. as described in FIGS. 1A & 1B in the next section).

An example isolator in accordance with the present disclosure comprises two layers. A top layer includes one or more heaters and temperature sensors. The wire traces to the heaters and temperature sensors may be connected to four wire bond pads, which extend outside the footprint of the supported DRG die. Thus, wire bonds from the pads are connected to the LCC feedthroughs. A bottom layer comprises a plurality of isolation beams (e.g. three or four) which extend from a central region to one or more peripheral regions of the layer. The two layers may be separately fabricated by micromachining, and then joined together via thermal compression bonding at the wafer level.

Embodiments of the present disclosure may be developed with optional structural elements and variables. For example, the top layer may also include a plurality of isolation beams which extend from a central region to one or more peripheral regions of the top layer. For layers that include isolation beams, the one or more peripheral regions may comprise either separate radial symmetric pads (e.g. one connected to each isolation beam) or an outer frame (connected to all of the isolation beams). It is also possible that a plurality of isolation beams may be connected to a radial symmetric pad.

Another important structural variable for different embodiments involves bonding between the top and bottom layers of the isolator and to the MEMS die and supporting package (e.g. vacuum package). Bonding between the top and bottom layers may occur either at the one or more periphery regions (e.g. an outer frame) or at central regions of the layers. Similarly, bonding of the top layer to the MEMS die and bottom layer to the vacuum package may also occur either at the one or more periphery regions (e.g. an outer frame) or at central regions of the layers. Typically, if the two layers are bonded together at their central regions, then the bonds to the MEMS die and the package will be at the one or more periphery regions of the top and bottom layers, respectively, or visa versa.

2. Current Disc Resonator Gyroscope and Packaging

Figure 1A:
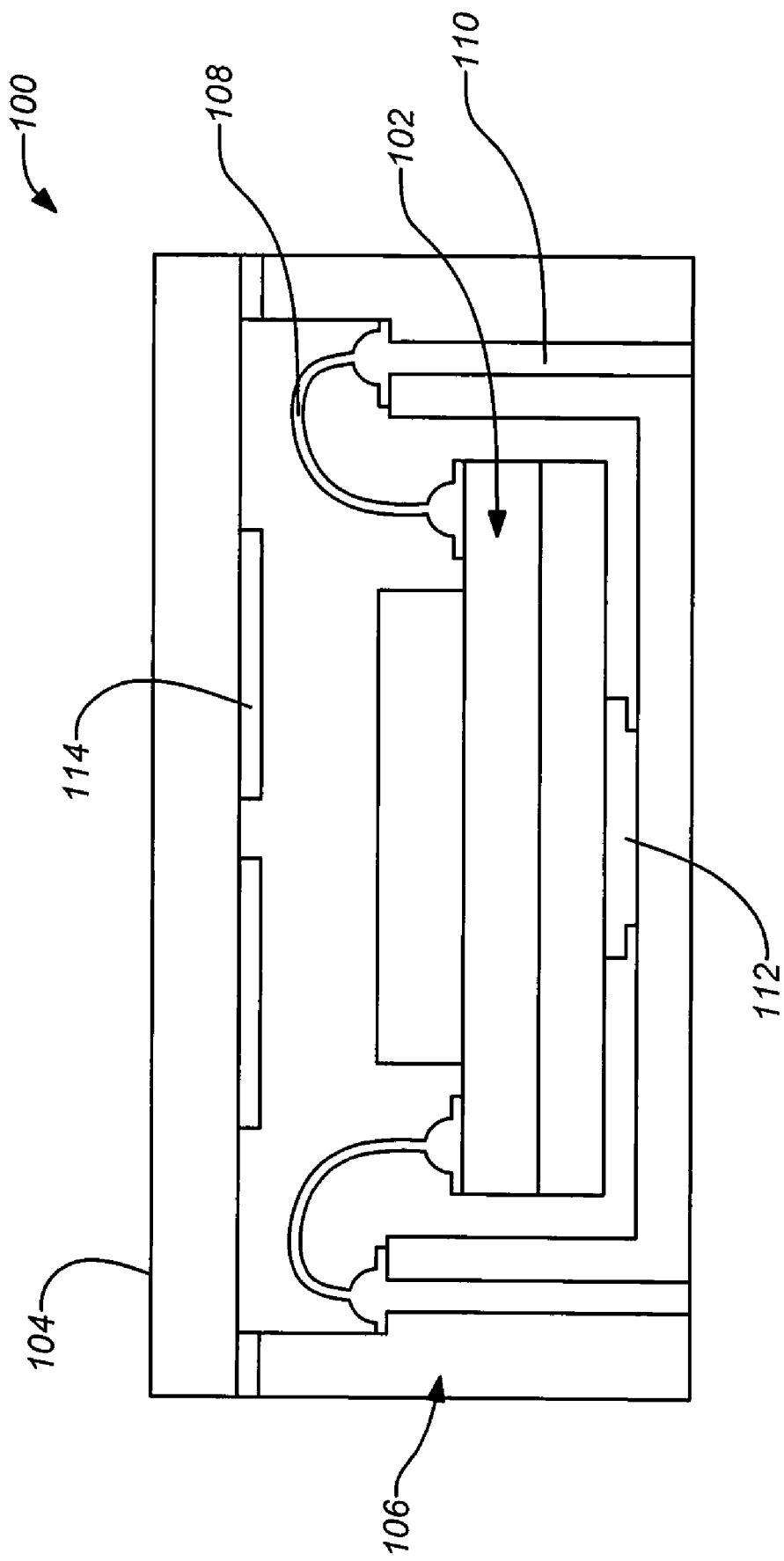
FIG. 1A illustrates a current disc resonator gyroscope (DRG) device.

FIG. 1A illustrates a current disc resonator gyroscope (DRG) assembly 100. Current DRGs have been realized using micromachining and ceramic leadless chip carrier (LCC) vacuum package 106 as shown. A typical assembly 100 includes a core DRG die 102, which comprises a three-layer silicon or quartz MEMS gyro chip enclosed in a ceramic LCC package 106, which provides a hermetic vacuum seal in order for the gyroscope to function properly. The LCC package may include a lid 104 bonded with a thermal compression bond to the remainder of the package 106. Wire leads 108 are attached between the DRG die 102 and the feedthroughs 110 in the package 106. The DRG die 102 is centrally bonded to the package 102 with a compression bond 112. In addition, the lid 104 of the package 106 includes a getter 114 to aid in forming the vacuum. For a detailed description of an exemplary current DRG assembly, see e.g. U.S. patent application Ser. No. 11/757,395, which is incorporated by reference herein.

Figure 1B:
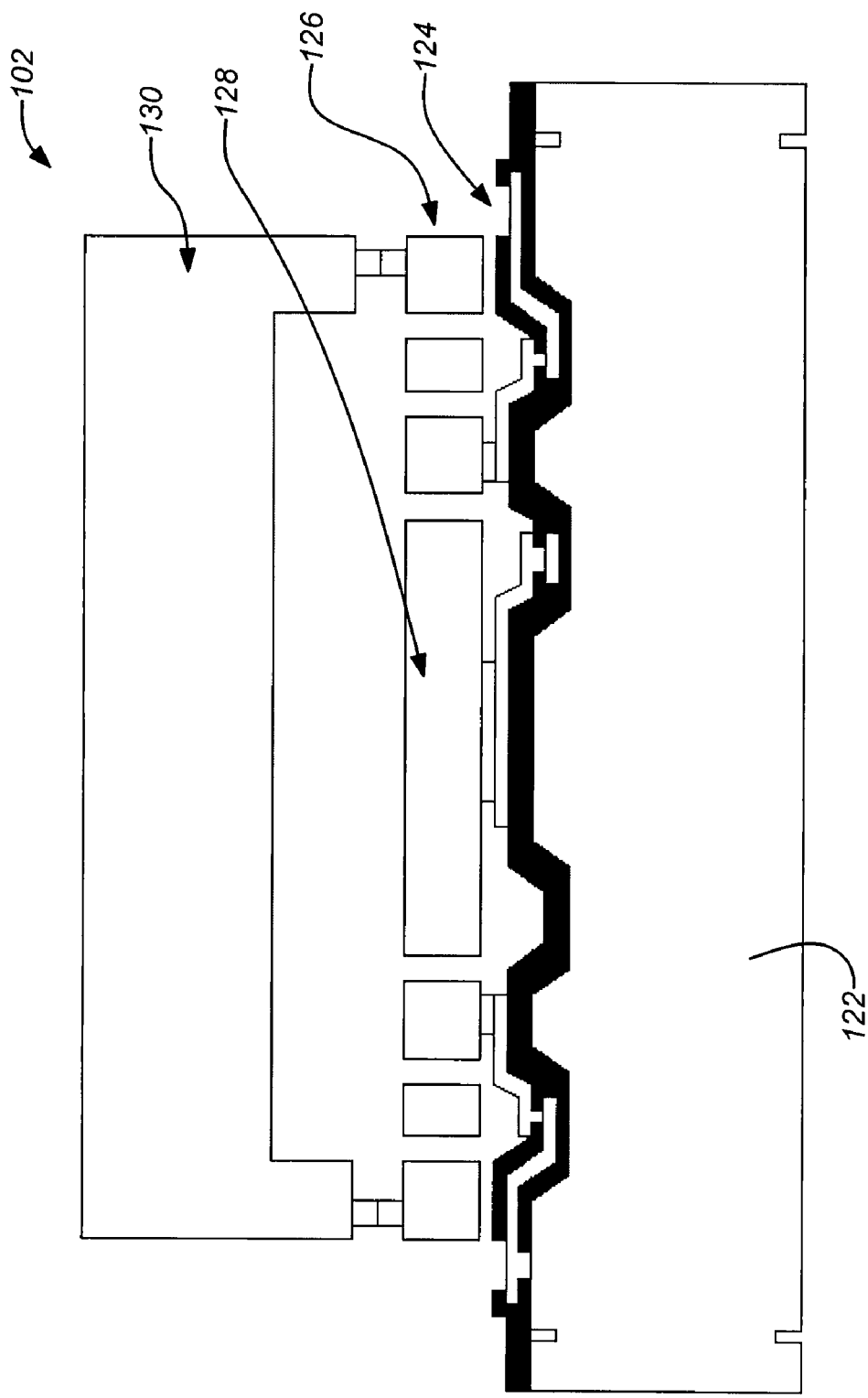
FIG. 1B is a schematic of the DRG chip for the current DRG assembly.

FIG. 1B is a schematic of the DRG chip for a current DRG die 102 as shown in FIG. 1A. The core DRG die 102 is a MEMS gyro chip including three discrete layers silicon or quartz, each separately micromachined, and then assembled together via gold-tin eutectic bond. The bottom electrode carrier layer 122 features CMOS electrodes 124 patterned onto it for driving, sensing, and biasing the active resonator capacitive electrode elements. It also provides structural support and electrical interfaces to the external package. The center DRG layer 126 includes the through-etched disc resonator 128. The top layer comprises the dust cover cap 130 to provide protection against damage during handling and testing. Typically, the dust cover cap 130 is permanently attached to the DRG, though the purpose is to keep the particles out during the assembly process. The dust cap is not typically bonded with a hermetic seal.

The die 102, once fabricated and diced, is then ready to be attached and sealed inside a standard LCC package. The die 102 is first bonded to the bottom of the LCC package 106 (see FIG. 1A), e.g. via a gold-tin eutectic bond with the gold-tin preform deposited in the center of the package 106. Once the die 102 is securely attached, it is wire bonded to the LCC feedthroughs 110 to provide the electrical interface. Finally, the lid 104, with pre-attached getter 114, is heated in vacuum to activate the getter, and then compressed against the package 106 to bond and form the final vacuum seal.

The conventional DRG assembly 100 (as described in FIGS. 1A & 1B), while providing an excellent vacuum package and a sufficient platform for performance demonstrations under laboratory conditions has limitations handling measurements in a real world environment. For example, the DRG assembly 100 has some high temperature sensitivity, non-repeatable turn-on bias, and some dynamic instability over time, which would may render the device inoperable over large temperature excursions. The cause of such instability with the DRG assembly 100 may be attributed to three major factors.

First, the DRG die is rigidly attached to the LCC package through the bonding of dissimilar materials. The area of the bonding pads encompasses about a ninth of the die's bottom surface, and is situated right beneath the active resonator. The inflexibility of the thermal compression bond, combined with large CTE mismatch and a large affected area, may induce high thermal mechanical stress and distortion both in the die and the LCC package. As a consequence the device may be very sensitive to temperature changes. Furthermore, any applied stress to the LCC may be transmitted through the rigid bond pad with little or no cushioning. This can cause high sensitivity to external stress or vibration.

Second, gold-tin eutectic bond and getter activation requires high processing temperatures, e.g. as high as 400° C. The rapid heating and cooling of rigidly bonded dissimilar materials over large temperature cycles during vacuum packing causes the bond pads to store a huge amount of residual stress. Depending on the magnitude of the residual stress, the bonded structure can exhibit moderate to highly unpredictable structural instability, which then manifest itself in the non-repeatability of turn on bias, and the random change in the sensor dynamics over time.

3. Exemplary Isolators for a MEMS Die

In this section, two distinct exemplary embodiments are described. FIGS. 2A to 4B a complex isolator employing isolation beams on both the top and bottom layers as well as separate radial symmetric pads coupled to the beams at the periphery of each layer. Bonding between the top and bottom layer is at the central regions of the layers. FIGS. 5A to 6O describe exemplary processes for producing the top and bottom layers of the exemplary isolator described in FIGS. 2A to 4B. FIGS. 7A to 9B describe a simpler isolator employing isolation beam on only the bottom layer attached to a single outer frame. The layers are bonded together at their peripheries.

Figure 2A:
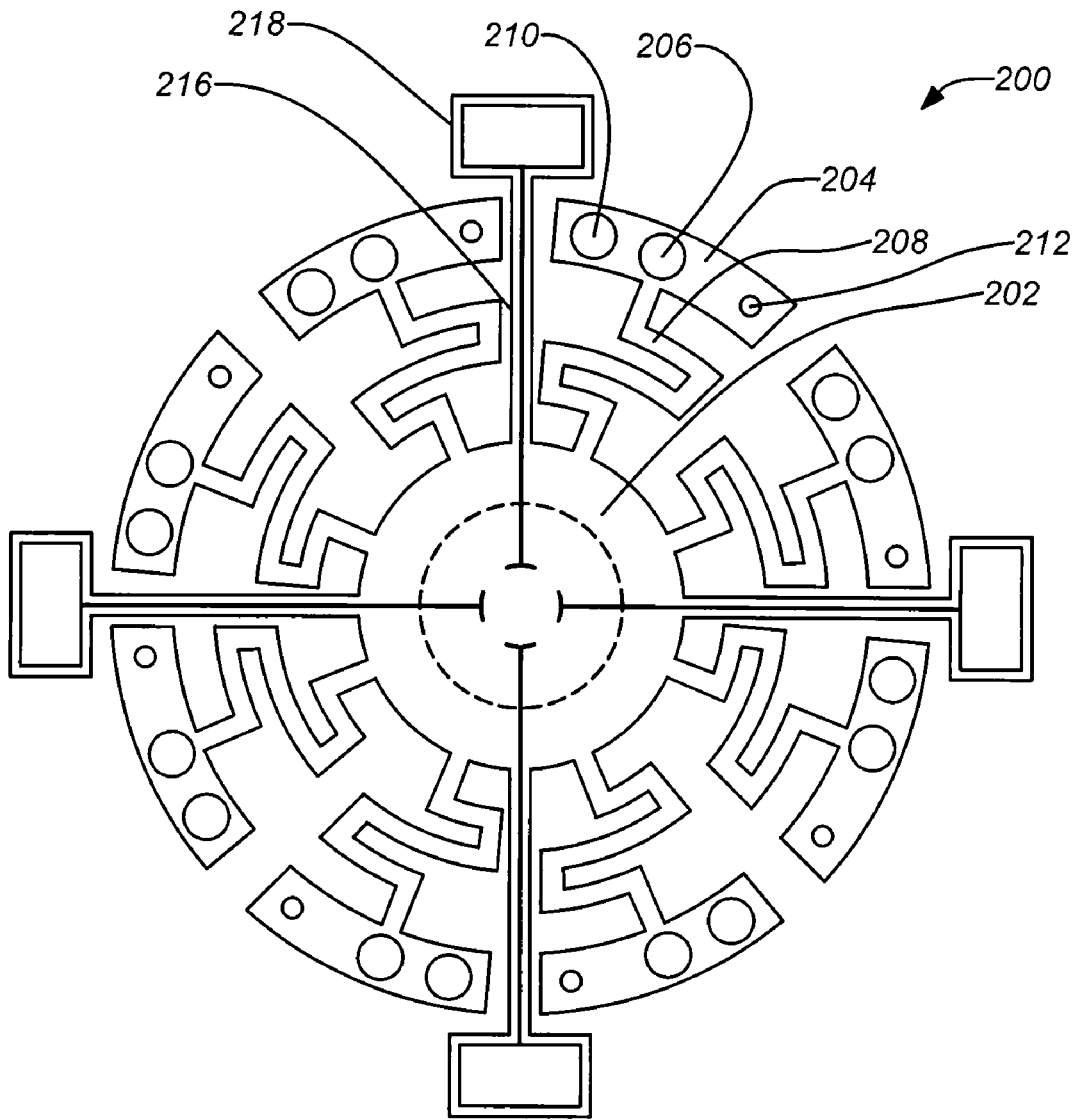
FIGS. 2A & 2B show a layout (top and side views, respectively) of an exemplary top layer for an isolator for a MEMS die.
Figure 2B:
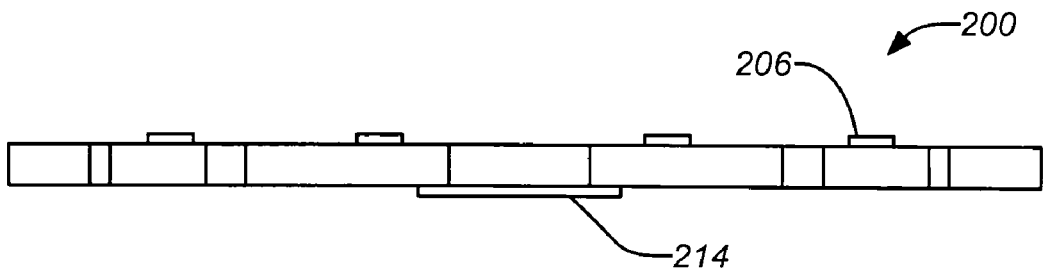

FIGS. 2A & 2B show a layout (top and side views, respectively) of an exemplary top layer 200 for an isolator for a MEMS die (that may include a DRG). The top layer 200 includes a central region 202 that comprises a circular support. Gold-tin preform bond pad 214 on the underside may be used to bond to the bottom layer via a eutectic bond. The example top layer 200 also includes eight radial symmetric pads 204 (referencing one example pad). The bond pads 204 are radial symmetric because they a laid out in a radial symmetric pattern. Gold-tin bumps 206 (referencing one example bond bump) on each pad 204 may be used for attachment of the pads 204 to the DRG die via a eutectic bond. The eight pads 204 are connected to the center support 202 via eight thermal and mechanical isolation beams 206 (referencing one example isolation beam) in a spiral configuration as shown. Each isolation beam 206 is substantially radial, i.e. it is attached at the central region 202 at one end and the oppose end extends to an extended radial position. The path to the extended radial position may vary. In the example, each of the plurality of substantially radial top layer isolation beams comprises a plurality of circumferential segments and radial segments connected in series (e.g. four radial segments interconnected with three circumferential segments).

In the example, each pad 204 of the top layer 200 includes a resistive heater 210 and a temperature sensor 212, situated next to the gold bump for regulating temperature of the MEMS die (e.g. a DRG) under active control. Electrical connections are provided by wire traces (not shown) that run along the isolation beam from the heaters 210 and sensors 212 to the central region 202, and then out along wire bond support beams 216 (referencing one example wire bond support beam) to the four wire bond pads 218 (referencing one example wire bond pad). Although the example embodiment shows four wire bond support beams 216 and pads 218, those skilled in the art will appreciate that any number of such beams 216 and pads 218 may be used as necessary to provide the proper number of connections to the heaters 210 and sensors 212. Note that multiple traces may occupy a beam 216 and multiple connections may be provided at each pad 218.

In the example top layer 200 there are four radial symmetric wire bond pads 218, which are connected to the central region 202 via four straight wire bond support beams 216, allowing electrical connections to be made to the heaters 210 and temperature sensors 212. In the example, each of the four wire bond pads is connected one of the following: heater +, heater −, temp sensor +, temp sensor −. The length of the beams is selected so that the pads extend outside the footprint of the DRG die that is mounted above, thus allowing wire bond to be made to the LCC package feedthrough after die attachment as will be shown hereafter. The overall size (e.g. diameter) of the central support 202, and the size of the wire bond pads 218 may be determined by the size of the MEMS die (e.g. a typical DRG may be either 6 mm or 11 mm diameter). The temperature sensors provide feedback control to the heaters in a control system to substantially actively regulating a temperature of the MEMS die as will be understood by those skilled in the art. Any suitable known feedback control system for active temperature control may be employed.

The clearance between the MEMS die, the isolator, and the LCC package is provided by the gold-tin bumps 206 and the central perform pad 214. The thickness of the gold-tin bumps 206 may determined by the allowable vertical displacement, e.g. 5 μm. The spacing between adjacent beams may be determined through analysis and/or test to derive the allowable lateral displacement and allowable rotational displacement. Overall thickness of the isolator may be determined by the size or mass of the MEMS die to be supported, and the available space within the LCC package. For example a preferred thickness for an 11 mm DRG MEMS die is 250 μm. The beam width may be designed to provide vibration isolation for a particular frequency range, derived based on the mass of the die, the elasticity of the isolator material, and the operating environment as will be understood by those skilled in the art. The top layer 200 may be batch fabricated by through etching either silicon or fuse silica. Silicon has the advantage of superior mechanical strength. However, a silicon wafer must be oxidized first for the purpose of electrical insulation.

Figure 3A:
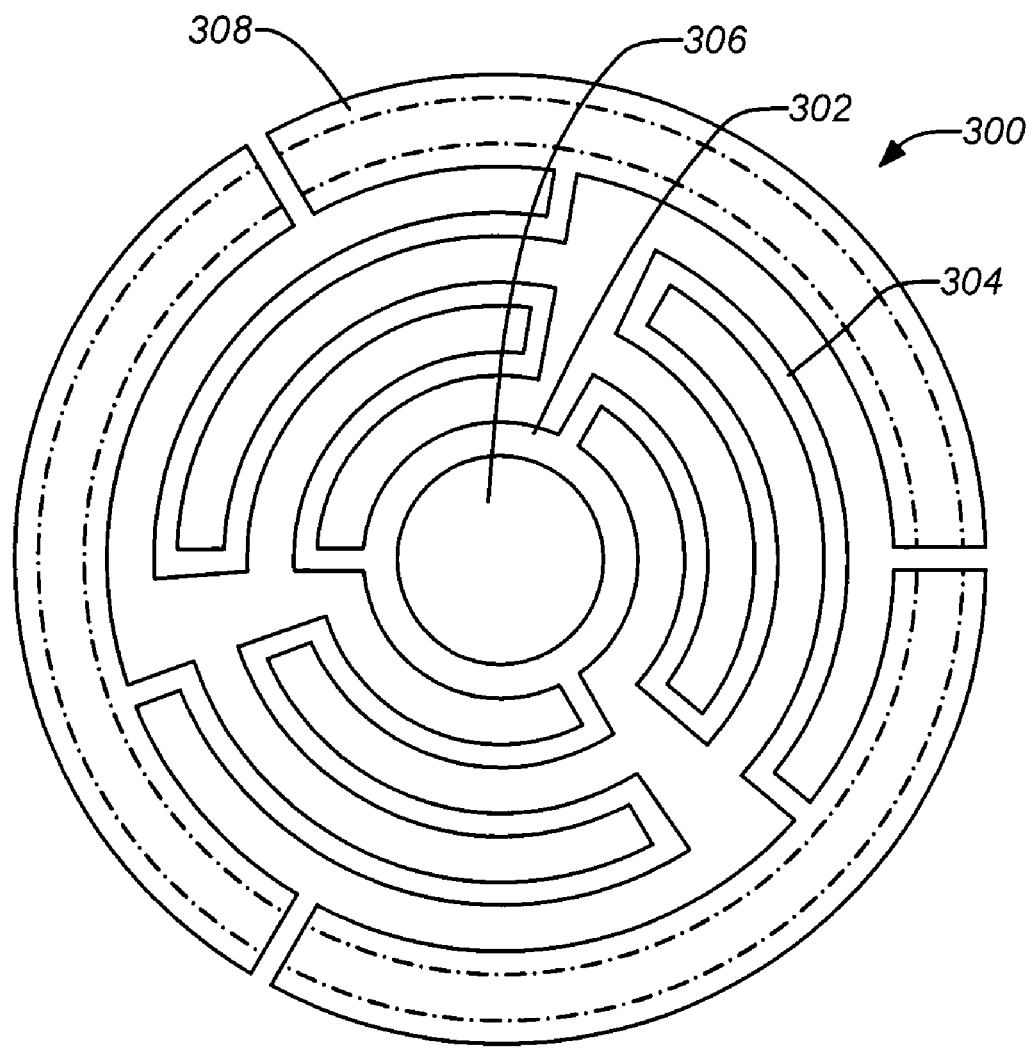
FIGS. 3A & 3B show a layout (top and side views, respectively) of an exemplary bottom layer for an isolator for a MEMS die.
Figure 3B:
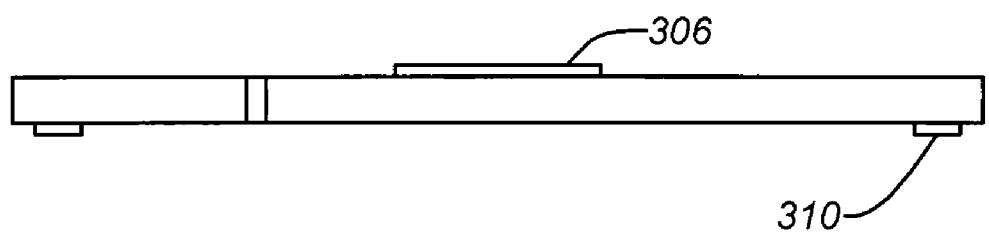

FIGS. 3A & 3B show a layout (top and side views, respectively) of an exemplary bottom layer 300 for an isolator for a MEMS die. Similar to the top layer 200 described above, the bottom layer 300 also includes a central region 302 as well as a plurality of substantially radial isolation beams 304 (referencing one example isolation beam). In this case, the example bottom layer 300 employs three isolation beams 304 (compared to the eight beams 208 of the example top layer 200). The central region 302 comprises a circular center support with gold-tin preform bond pad 306 is attached to the bottom side of the isolator top layer via eutectic bond. The isolation beams 304 each extend from the central region 302 to a package attachment support 308 (referencing one example package attachment support). Similar to the upper layer 200, the radially symmetric thermal mechanical isolation beams 304 of the bottom layer 300 may be in a spiral configuration connecting the central region 302 to the pads of the package attachment supports 308. Each of the plurality of substantially radial bottom layer isolation beams 304 may comprise a plurality of circumferential segments and radial segments connected in series, e.g. four radial segments and three circumferential segments interconnected as shown. The package attachment supports 308 may comprise a plurality of radially symmetric attachment with gold-tin preform bond pads 310 (referencing one example bond pad) on the underside of the bottom layer 300 for attachment to the LCC package via eutectic bond.

The overall dimension, diameter of the center support, and the size of the bond pads 306, 310 may be determined by the size of the MEMS die (e.g. a typical DRG may be either 6 mm or 11 mm diameter). Clearance between the MEMS die, the isolator, and the LCC package may be provided by thickness the gold-tin preform bond pads 310 of the attachment supports 308 and the thickness of the central bond pad 306. The appropriate thicknesses, e.g. 5 µm, may be determined by the allowable vertical displacement based upon analysis and/or testing as will be understood by those skilled in the art. Similarly, adequate spacing between adjacent beams may be determined by the allowable lateral displacement and rotational displacement through analysis and/or testing. Thickness of the top layer 200 and bottom layer 300 of the isolator is determined by the size or mass of the MEMS die, and the available space within the LCC package. For example, a thickness for the 11 mm diameter MEMS die for a DRG is 250 µm. Beam width may be designed to provide vibration isolation for a particular frequency range, determined by mass of the MEMS die, the elasticity of the isolator material, and the operating environment as will be appreciated by those skilled in the art. The bottom layer 300 can also be batch fabricated by through etching either silicon or fuse silica, with silicon the preferred material because of its superior mechanical strength. In this case, no oxidation is required since this layer 300 does not include electrical components.

Figure 4A:
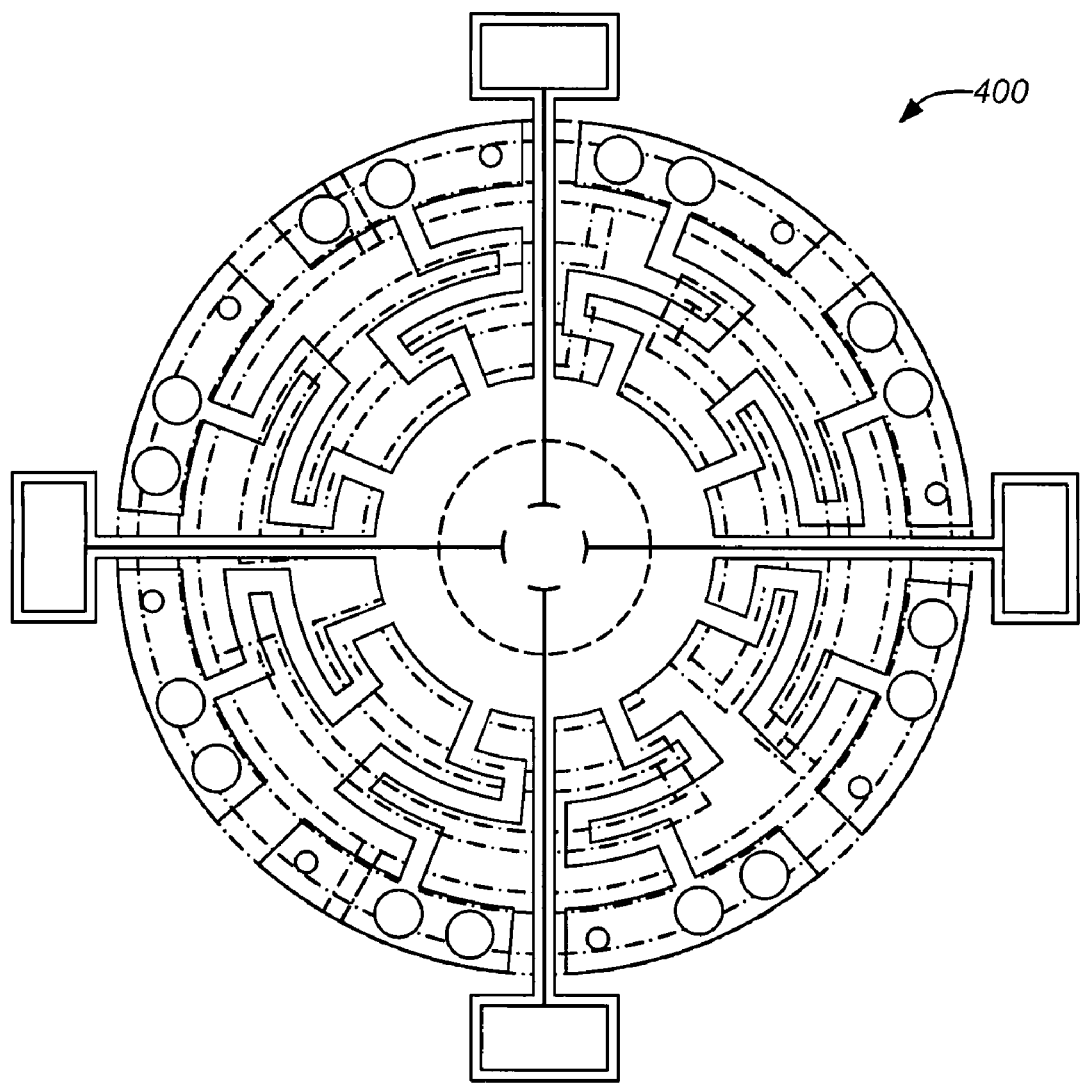
FIGS. 4A & 4B show an exemplary assembly (top and side views, respectively) of a top and bottom layer for an isolator for a MEMS die.
Figure 4B:
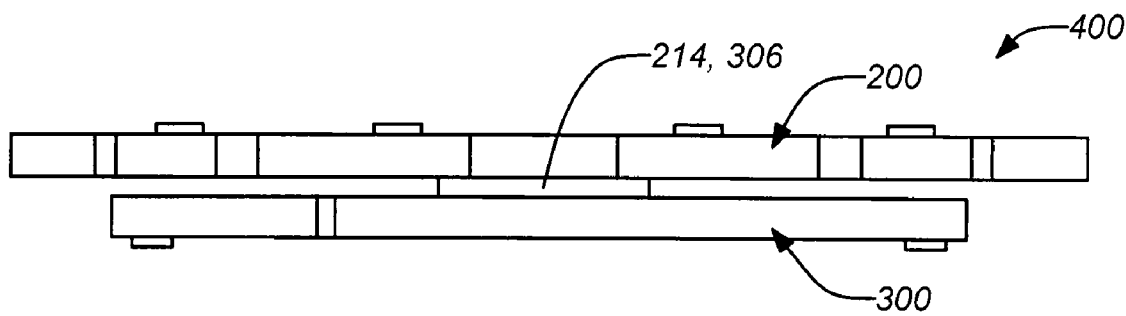

FIGS. 4A & 4B show an exemplary assembly 400 (top and side views, respectively) of a top and bottom layers 200, 300 for an isolator for a MEMS die. Once the top layer 200 and the bottom layer 300 are fabricated, they are joined together by thermal compression bond of the gold pads of the respective central regions 202, 302.

In a typical embodiment of the disclosure, the MEMS die may comprise a disc resonator for a disc resonator gyroscope (DRG), having embedded electrostatic electrodes having sidewalls that interact with interior sidewalls of the disc resonator such that vibration modes of the disc resonator are driven and sensed with the embedded electrostatic electrodes to measure motion of the disc resonator, and a baseplate having a topside bonded to support the disc resonator and having electrical traces coupled from the embedded electrostatic electrodes and to a baseplate periphery. Structure and operation of the DRG is known, e.g. as described in U.S. Pat. Nos. 6,944,931, 7,347,095, 7,040,163, 7,401,397, 7,168,318, 7,285,844, 7,396,478, and 7,437,253 which are all incorporated by reference herein. Those skilled in the art will appreciate that embodiments of the present disclosure can be applied to benefit any known DRG design.

It should be noted that although the primary embodiment of the disclosure is described applied to a MEMS die that includes a disc resonator gyroscope (DRG), embodiment of the disclosure are not limited to this application. Those skilled in the art will appreciate the inventive concept is applicable to any MEMs device that may be especially sensitive to mechanical and thermal environments.

Figure 5A:
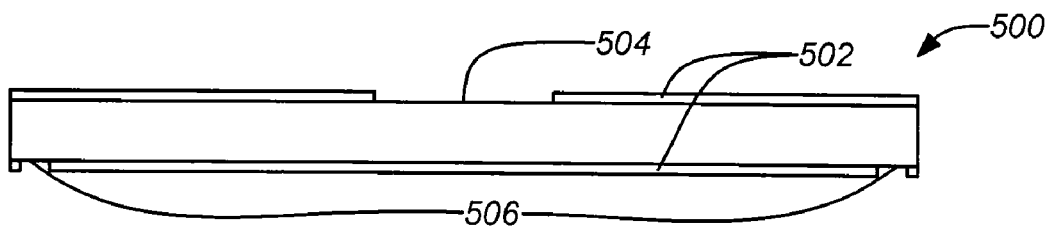
FIGS. 5A to 5F illustrate an exemplary process for producing a bottom layer for an isolator for a MEMS die.
Figure 5B:
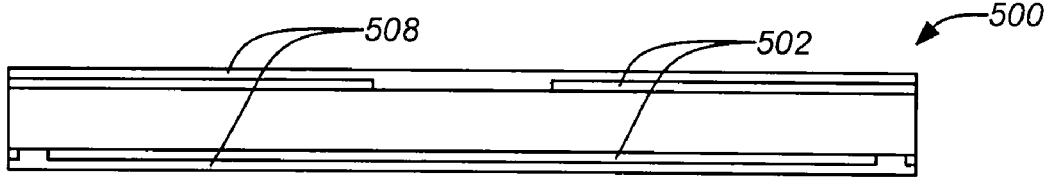
Figure 5C:
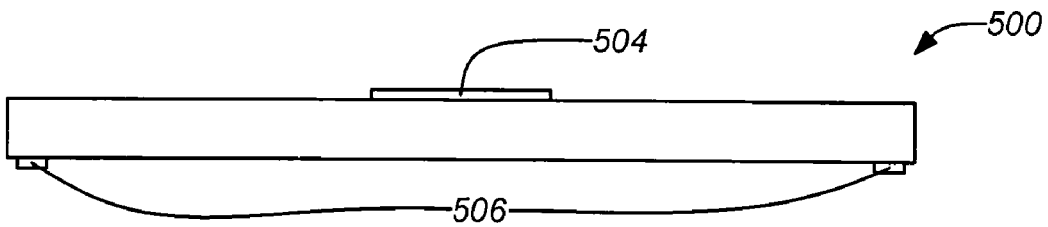
Figure 5D:
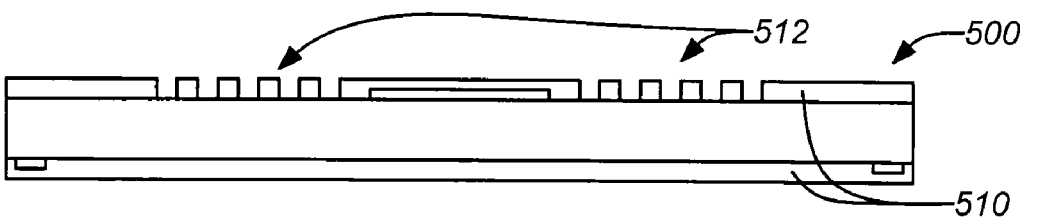
Figure 5E:
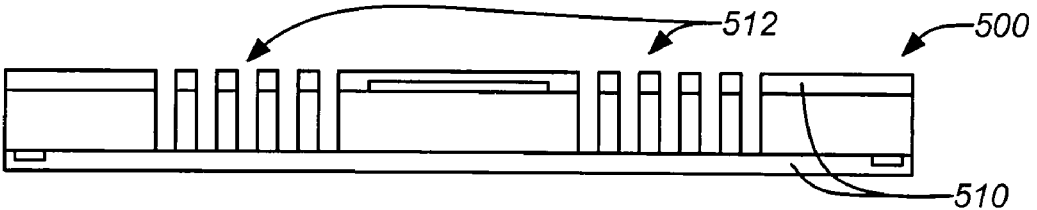
Figure 5F:
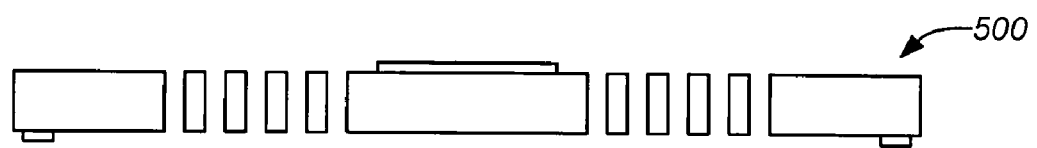

FIGS. 5A to 5F illustrate an exemplary process for producing a bottom layer 500 for an isolator for a semiconductor die. FIG. 5A illustrates depositing photoresist 502 on both sides of the semiconductor layer 500 (e.g. silicon or fused silica) patterned with locations for the central region bond pad 504 and the package attachment support bond pads 506. FIG. 5B illustrates depositing an adhesion layer and then 5 µm gold-tin perform layer 508. FIG. 5C illustrates liftoff of the excess gold-tin to form the pads 504, 506. FIG. 5D illustrates depositing photoresist 510 and patterning the isolation beam 512 geometry. FIG. 5E illustrates through etching to form the isolation beams 512. FIG. 5F illustrates removing the photoresist 510 and cleaning to yield the finished layer 500.

The finished bottom layer 500 is staged for bonding with the top layer 600. The top layer 600 may be manufactured from either a quartz wafer or oxidized silicon wafer. The applied oxidation is to ensure electrical isolation between the heaters and temperature sensors. The top layer 600 may be fabricated as described hereafter.

Figure 6A:
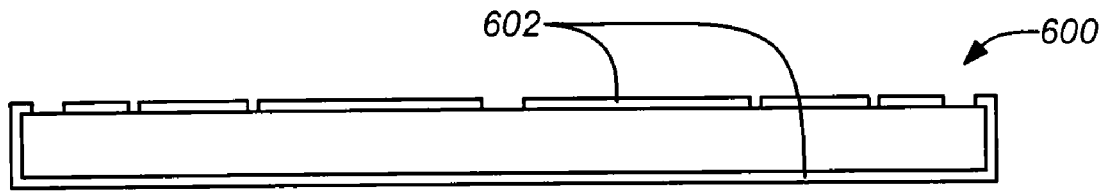
FIGS. 6A to 6O illustrate an exemplary process for producing a top layer for an isolator for a MEMS die.
Figure 6B:
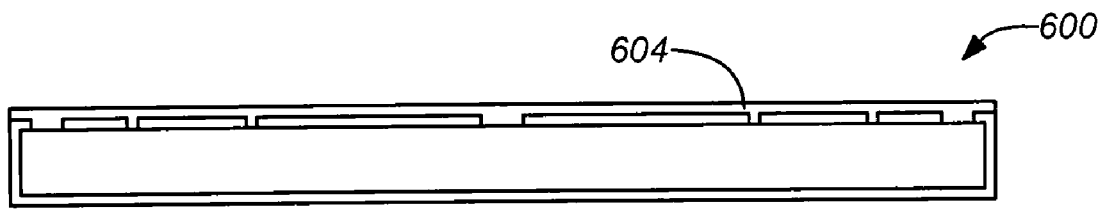
Figure 6C:
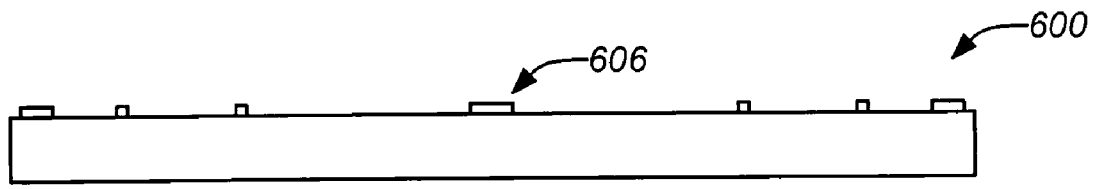
Figure 6D:
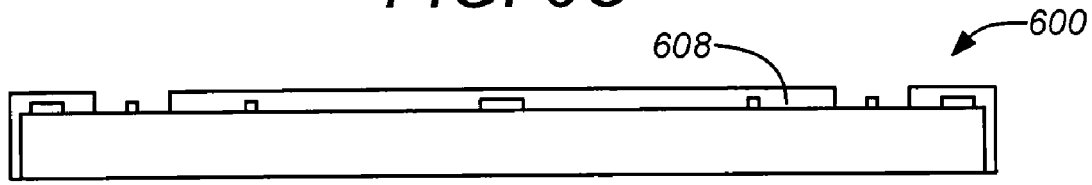
Figure 6E:
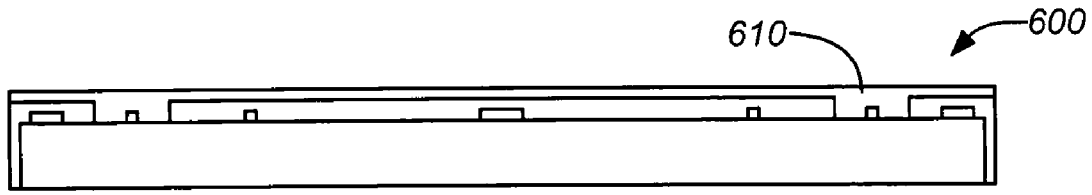
Figure 6F:
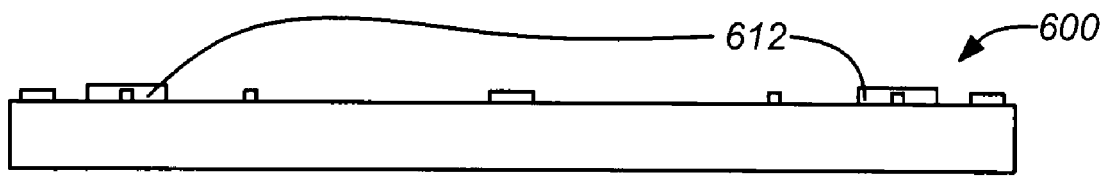
Figure 6G:
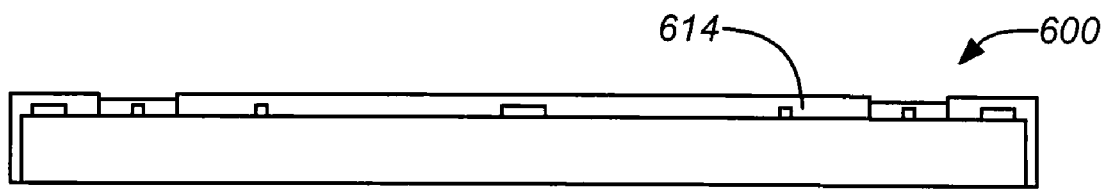
Figure 6H:
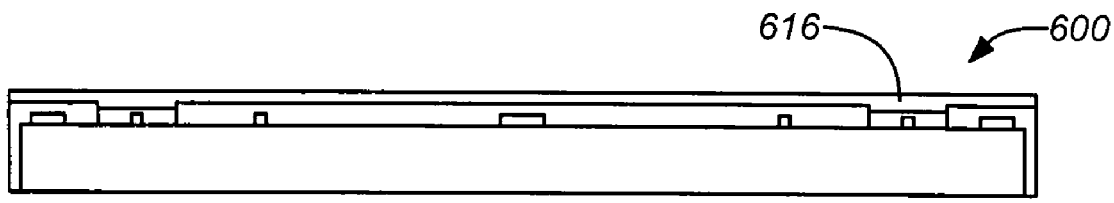
Figure 6I:
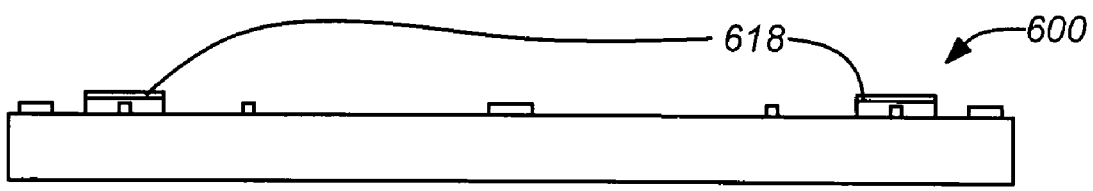
Figure 6J:
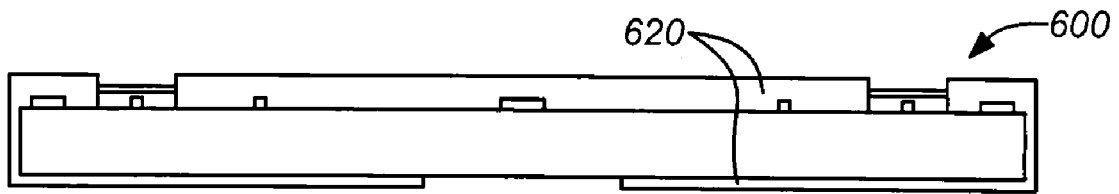
Figure 6K:
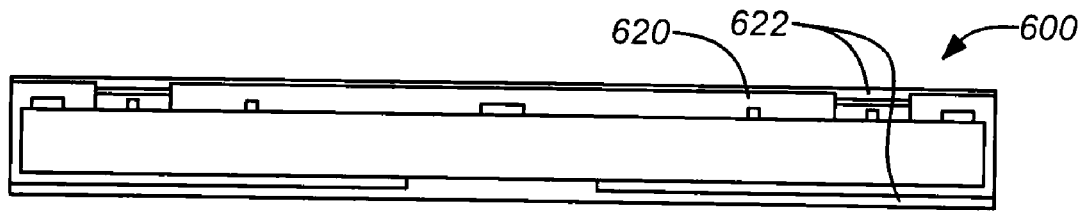
Figure 6L:
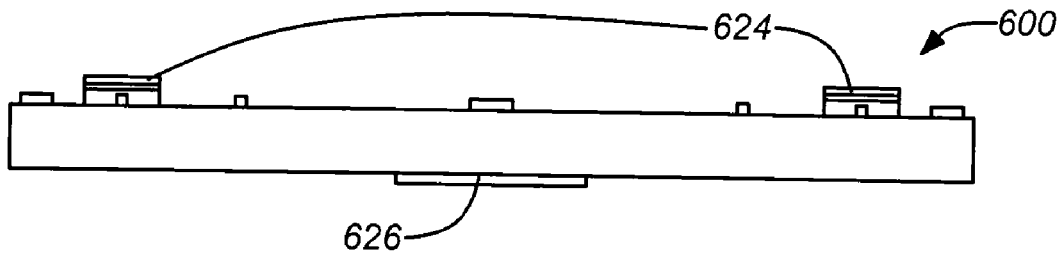
Figure 6M:
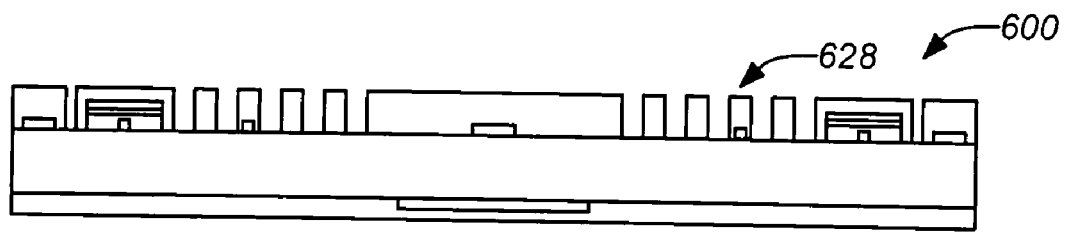
Figure 6N:
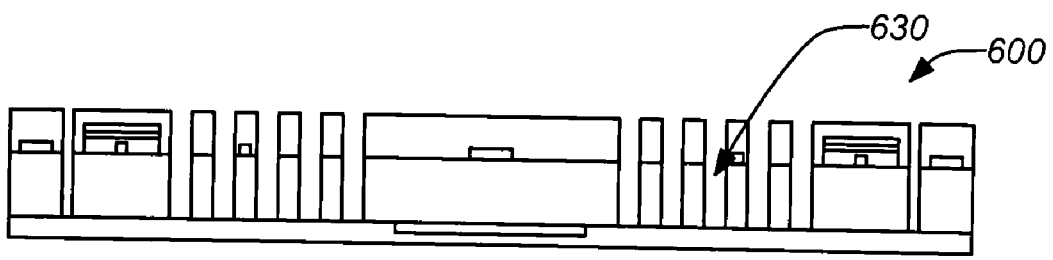
Figure 6O:
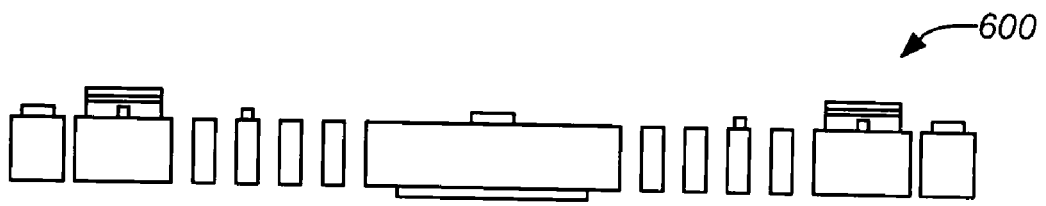

FIGS. 6A to 6O illustrate an exemplary process for producing a top layer 600 for an isolator for a semiconductor die. FIG. 6A illustrates depositing a photoresist layer 602 on both sides and patterning for the wire traces for the temperature sensors and heaters. FIG. 6B illustrates depositing an adhesion layer and then a 1 µm thickness wire trace gold layer 604. FIG. 6C illustrates liftoff of the excess gold to yield the wire traces 606 (indicated in the figure by the separate bumps) on the top surface of the layer 600. FIG. 6D illustrates depositing a photoresist layer 608 and patterning on the top surface for the heaters. FIG. 6E illustrates depositing a 1 µm thick resistive metal heater material 610, such as a nickel-chromium alloy or any other known suitable material. FIG. 6F illustrates liftoff of the excess metal heater material to form the heaters 612. FIG. 6G illustrates depositing another photoresist layer 614 and patterning for the temperature sensors. FIG. 6H illustrates depositing a 1 µm thick temperature sensor material 616, such as platinum or any other known suitable material. FIG. 6I illustrates liftoff of the excess temperature sensor material to form the temperature sensors 618. FIG. 6J illustrates depositing another photoresist layer 620 on both sides of the top layer 600 and patterning it for the bond pads. FIG. 6K illustrates deposit an adhesion layer and then a 5 µm gold-tin perform layer 622 over the photoresist layer 620 on both sides of the top layer 600. FIG. 6L illustrates liftoff of the excess metal to form the semiconductor die bond pads 624 as well as the bottom layer bond pad 626. FIG. 6M illustrates depositing a photoresist layer 628 on both sides and patterning the top side for the isolation beam geometry. FIG. 6N illustrates through etching the top layer 600 from the top side to form the isolation beams 630. FIG. 6O illustrates removing the remaining photoresist layer 628 and cleaning to yield the completed top layer 600 structure. The top layer 600 is now ready to be staged for bonding with the bottom layer 500 (as shown in the example of FIGS. 4A & 4B).

The isolator assembly may be produced through known micromachining of oxidized silicon or fused silica wafers as previously described. The top layer 600 and bottom layer 500 may be separately fabricated as described above on different wafers and then joined together in a single thermal compression bond at the wafer level. The finished wafer stack may then be diced to singulate each isolator assembly.

Figure 7A:
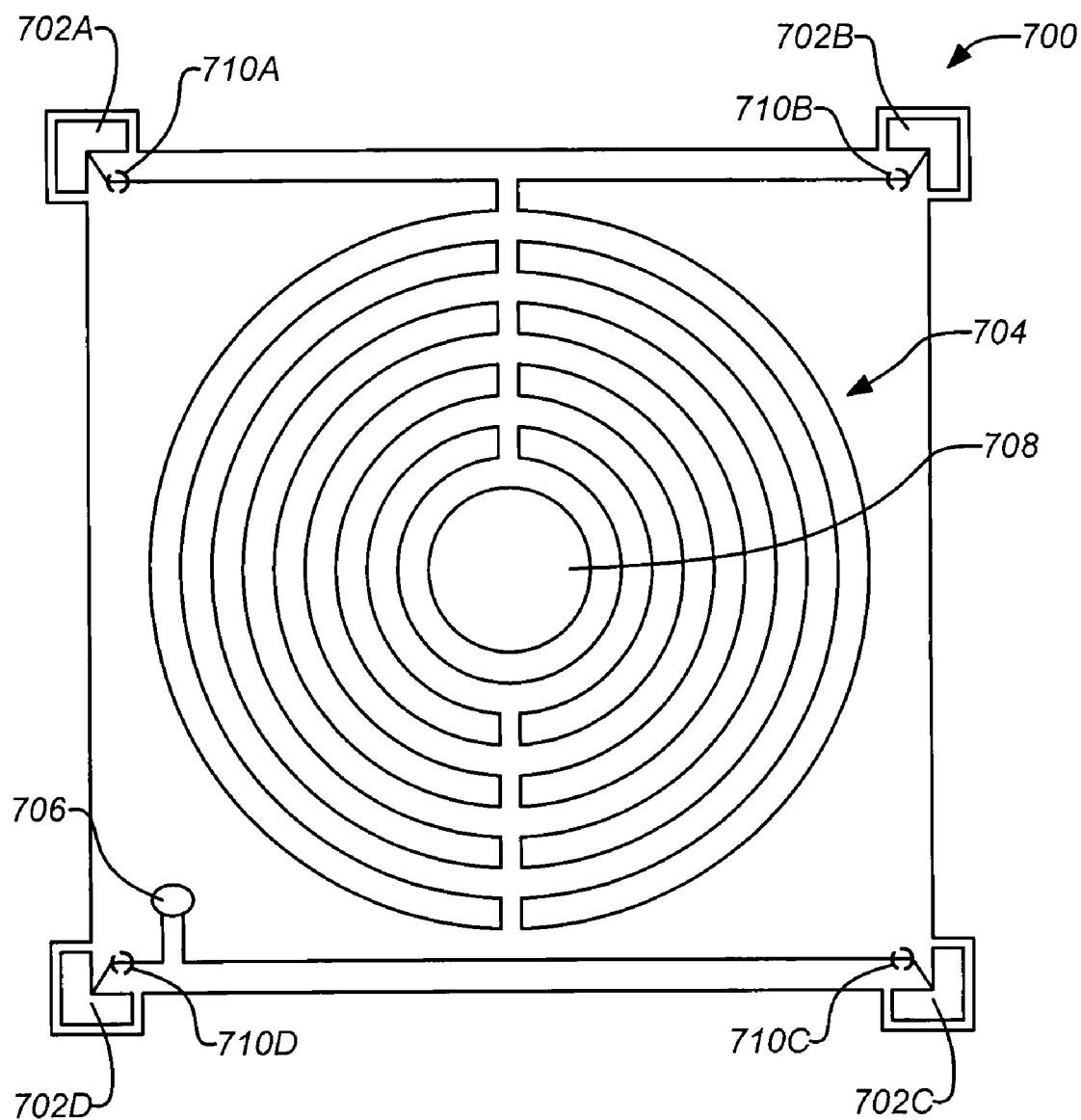
FIGS. 7A & 7B show a layout (top and side views, respectively) of another exemplary top layer for another isolator for a MEMS die.
Figure 7B:
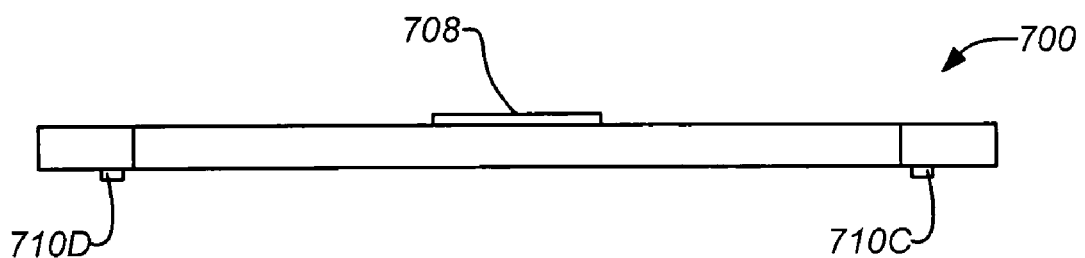

FIGS. 7A & 7B show a layout (top and side views, respectively) of another exemplary top layer 700 for another isolator for a MEMS die. The top layer 700 is in a square configuration with bond pads 702A-702D at each corner that extend outside the footprint of the MEMS die when assembled to facilitate wire bonds connections. Bond pads 702A & 702B are coupled to the resistive heater element 704. The resistive heater element may be deposited onto the top layer 700 through the process described above in FIGS. 6A to 6O for developing the top layer 600. However, in this embodiment the resistive heater element 704 comprises a pattern of interconnected circumferential segments arranged such that a trace is evenly distributed over a large area of the top layer 700. Those skilled in the art will appreciate that many alternate suitable patterns for the resistive heater element 704 may be formed depending upon the overall thermal design for the isolator. Bond pads 702C & 702D are coupled to the temperature sensor element 706 which may also be deposited onto the surface of the top layer 700 through the process described above in FIGS. 6A to 6O for developing the top layer 600. As previously described, the temperature sensor provides feedback control to the heater in a control system to substantially actively regulating a temperature of the MEMS die as will be understood by those skilled in the art. Any suitable known feedback control system for active temperature control may be employed. It should also be noted that although only a single heater element 704 and temperature sensor element 706 are shown in this example, any number of heater and sensor elements may be employed.

The top layer 700 also includes a large central bond pad 708 on the upper surface for bonding to the MEMS die at assembly. On the lower surface four smaller bond pads 710A-710D are disposed, one at each corner of periphery of the layer 700. These bond pads 710A-710D are used to bond to the lower layer 800 described hereafter.

Figure 8A:
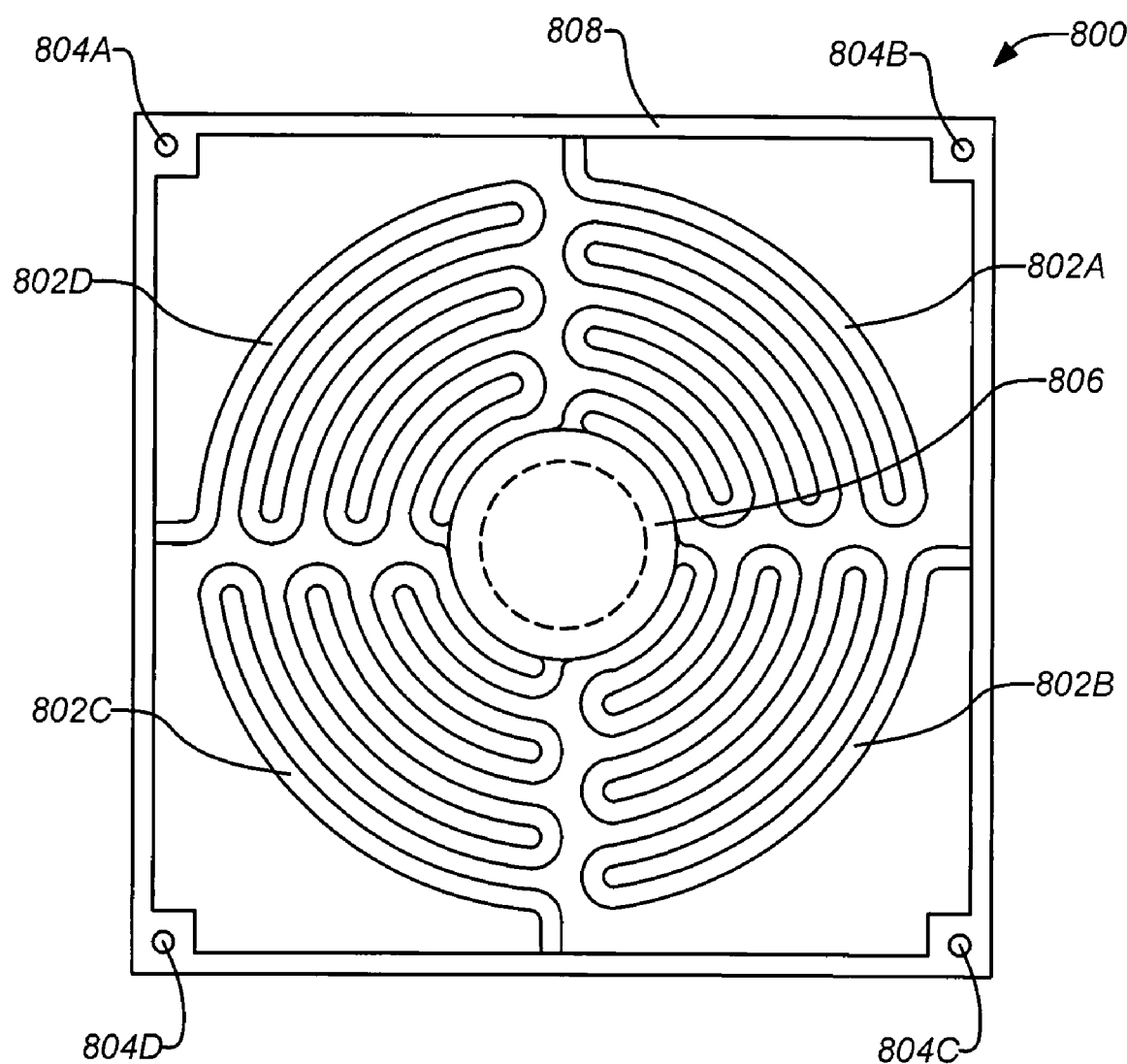
FIGS. 8A & 8B show a layout (top and side views, respectively) of another exemplary bottom layer for an isolator for a MEMS die.
Figure 8B:
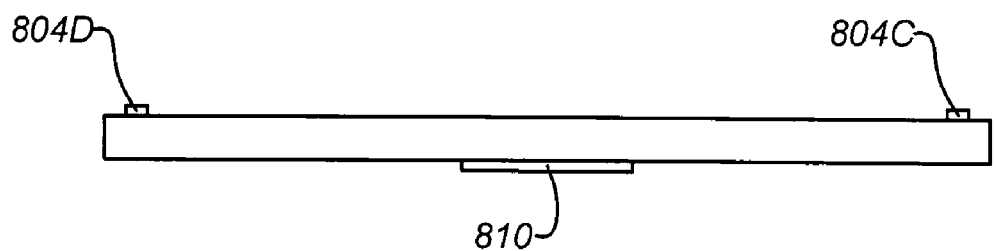

FIGS. 8A & 8B show a layout (top and side views, respectively) of another exemplary bottom layer 800 for an isolator for a MEMS die. The bottom layer 800 comprises four substantially radial bottom layer isolation beams 802A-802D to provide vibration isolation for the supported MEMS die. Each of the bottom layer isolation beams 802A-802D extends from a bottom layer central region 806 to a peripheral region of the bottom layer 800. In this example, the peripheral region of the bottom layer 800 comprises an outer frame 808. Beam width of the substantially radial bottom layer isolation beams 802A-802D is selected to provide vibration isolation as will be understood by those skilled in the art. The isolation beams 802A-802D may be through etched through a process similar to the process described above in FIGS. 5A to 5F for developing the bottom layer 500.

The bottom layer 800 also includes a large central bond pad 810 on the lower surface for bonding to the vacuum package at assembly. On the upper surface four smaller bond pads 804A-804D are disposed, one at each corner of periphery of the layer 800, i.e. the outer frame 808. These bond pads 804A-804D are used to bond to the upper layer 700 described hereafter.

Figure 9A:
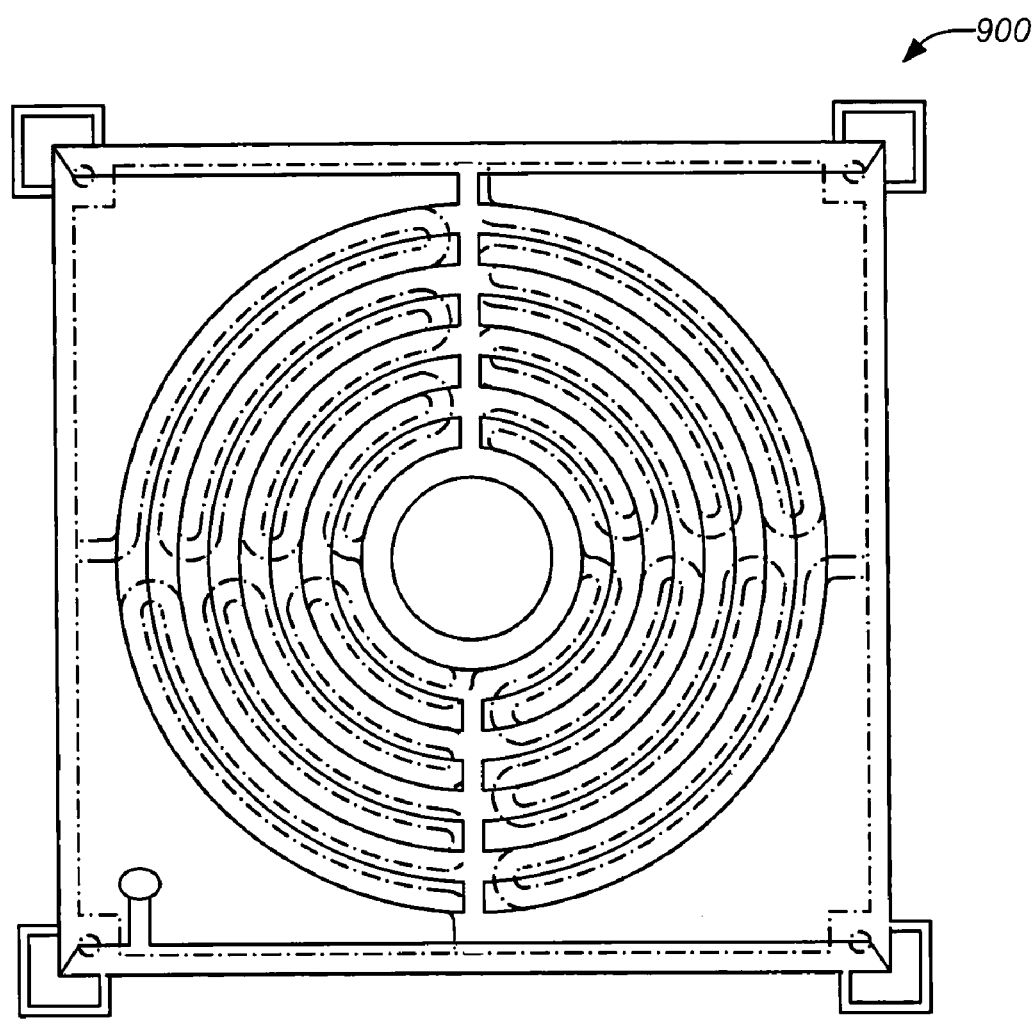
FIGS. 9A & 9B show another exemplary assembly (top and side views, respectively) of a top and bottom layer for an isolator for a MEMS die.
Figure 9B:
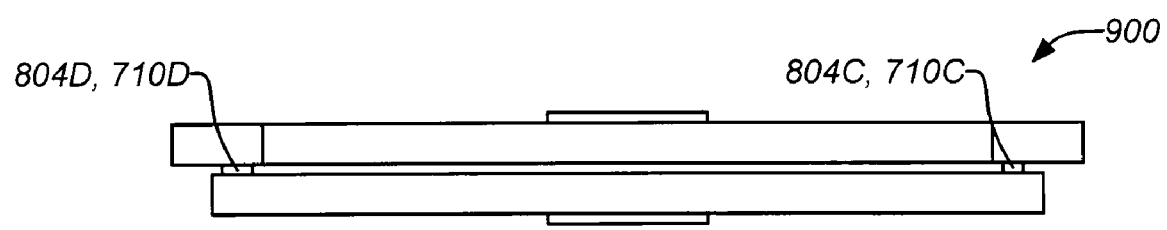

FIGS. 9A & 9B show another exemplary assembly (top and side views, respectively) of a top and bottom layer 700, 800 for an isolator 900 for a MEMS die. Once the top layer 700 and the bottom layer 800 are fabricated, they are joined together by thermal compression bond of the gold bond pads 710A-710D, 804A-804D of the respective peripheral regions, i.e. the outer frame 808 of the bottom layer 800 to the periphery of the top layer 700.

The top and bottom layers of the exemplary isolator 900 embodiment of FIGS. 7A to 9B may be produced in a manner similar to the processes defined in FIGS. 5A to 6O above. However, many processes may be eliminated (e.g. through etching the upper layer) to produce this exemplary isolator 900 as will be understood by those skilled in the art because the design is simpler. It should also be noted that although this isolator 900 is shown in a square configuration, it may also be produced in other shapes. For example, a circular shape having a circular outer frame may also be employed.

The location and type of temperature sensor that may be employed is another variable in implementing an isolator device. In some embodiments, a-heater control ASIC may be located with the MEMS die, e.g. a disc resonator die of a gyroscope. For example, the heater control ASIC may be mounted under a baseplate for the disc resonator. The control ASIC may include the one or more temperature sensors used to regulate the heater. In one notable example, a stable clock signal may be employed as a frequency reference. Regulating the heater temperature such that a frequency difference between the ASIC clock and a resonant frequency of the MEMS die is maintained at a substantially constant value has the effect of maintaining a substantially constant temperature of the MEMS die. Thus, the frequency difference operates as a proxy for the MEMS die temperature; the temperature sensor effectively comprises the frequency difference between the stable clock frequency and the resonant frequency of the MEMS die. In this manner, an ultra stable temperature control can be achieved. For example, if a clock has a frequency stability of 1 ppm/C over temperature, and if the MEMS die has 30 ppm/C frequency stability, the applied control will result in temperature of the MEMS die maintained within 1/30 of a degree C. The control ASIC may be any known integrated circuit device for controlling operation of the MEMS device on the semiconductor die, e.g. a disc resonator gyroscope, as will be understood by those skilled in the art.

The frequency of the MEMS die employed for temperature regulation may be the resonance frequency of any MEMS device (assuming the MEMS device is operated at some resonance). In one example embodiment, the resonant frequency of a disc resonator gyroscope applied for such temperature regulation may be the natural frequency of the N=2 mode of the disc resonator, or the second in-plane mode where the disc deforms elliptically.

4. Integrating Isolator with a MEMS Die

Figure 10A:
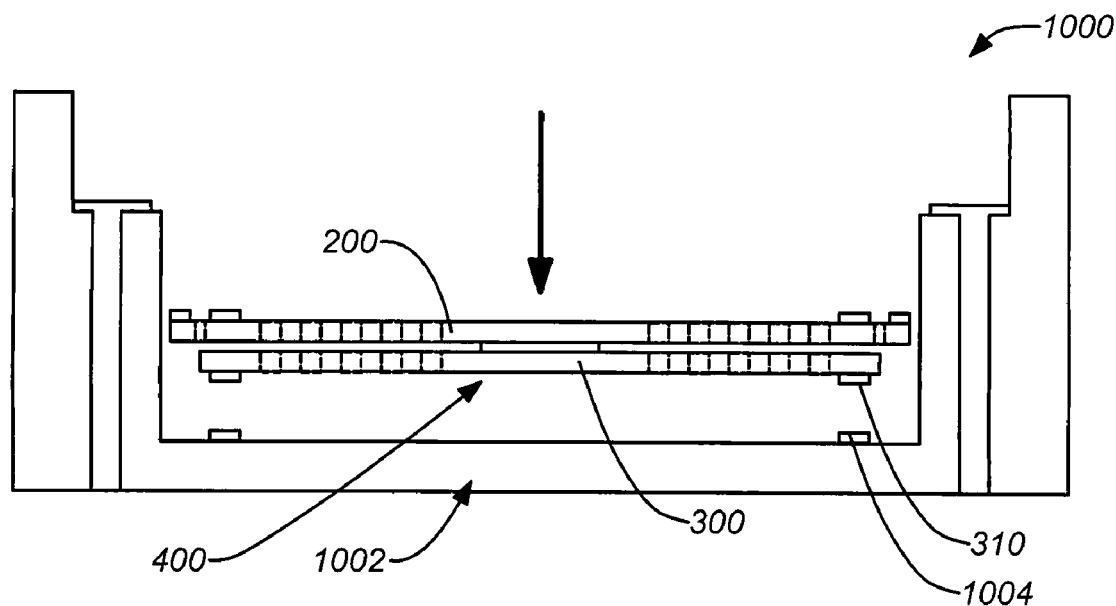
FIGS. 10A to 10C illustrate an exemplary process for integrating an exemplary isolator embodiment to isolate a semiconductor die comprising a disc resonator for a DRG.
Figure 10B:
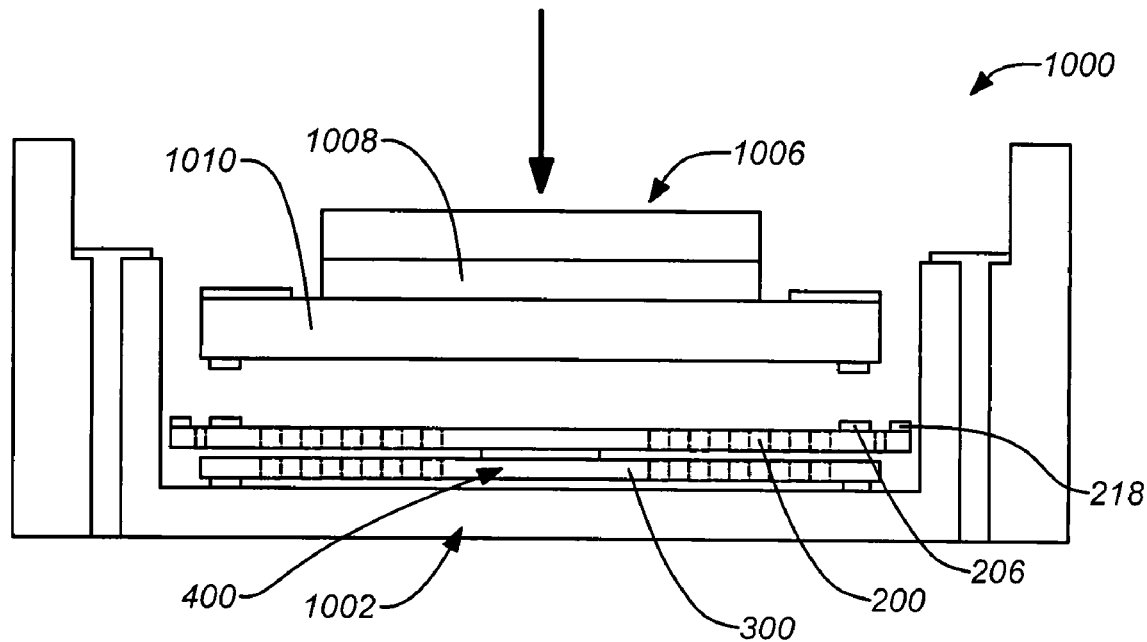
Figure 10C:
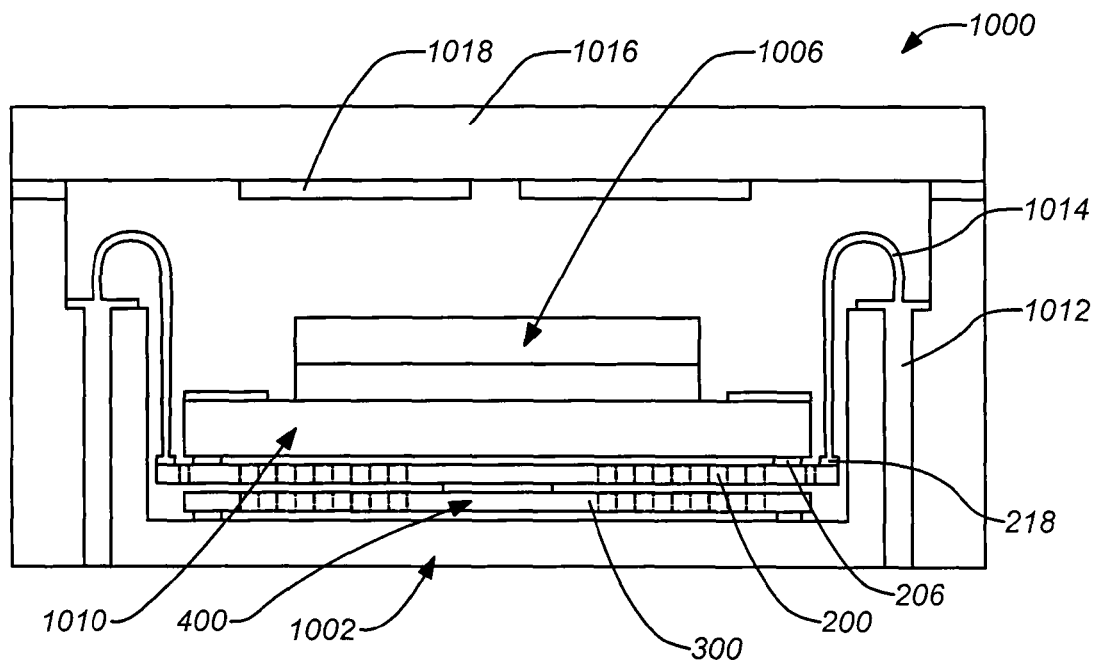

FIGS. 10A to 10C illustrate an exemplary process for integrating an exemplary isolator embodiment to isolate a MEMS die comprising a disc resonator for a DRG 1000. FIG. 10A illustrates the isolator assembly 400 (e.g. of FIGS. 4A & 4B) installed into the vacuum package 1002 such that each package attachment support 308 of the bottom layer 300 is bonded to a bottom interior of the vacuum package 1002 with matching bond pads 310, 704. FIG. 10B illustrates the semiconductor die 1006 that includes the disc resonator assembly 1008 supported on a baseplate 1010 that includes the electrical traces at the periphery to the embedded electrodes for operating the DRG as is known in the art. The periphery of the semiconductor die 1006 is bonded to the gold-tin bumps 206 on the separate radial symmetric pads 204 of the plurality of substantially radial top layer isolation beams on the top layer 200 of the isolator assembly 400. (Refer to the example top layer 200 of FIGS. 2A & 2B.) FIG. 10C shows the finished DRG 1000. The vacuum package 1002 includes electrical feedthroughs 1012 coupled to wire bonds 1014 which are coupled in turn to the electrical traces at the wire bond pads 218 on the top side of the top layer 200. Additional wire bonds and feedthroughs of the vacuum package 1002 are employed to provide electrical connection to the embedded electrodes (not shown) on the baseplate 1010 as is known in the art. The vacuum package 1002 comprises a lid 1016 including a getter material 1018 activated to assist producing a vacuum within the vacuum package 1002. The lid 1016 is bonded to close out the vacuum package 1002.

As shown, the isolator assembly 400 may be inserted between the semiconductor die 1006 and the LCC vacuum package 1002 in a single eutectic bond process, replacing the conventional step to attach semiconductor die 1006 directly to the LCC package 1002. (See FIGS. 1A & 1B.) Thus, there can be no disruption to prior or subsequent processing steps, nor does it affect the thermal budget of the process. As described, the small gold-tin bumps that are attached to the peripheral of the die can reduce the effect of residual stress to the semiconductor die. The materials for the isolator may be selected to match that of the die and minimize CTE mismatch. Long thin isolation beams can provide thermal isolation against external temperature change, which may be conducted though the LCC package. Furthermore, employing weak and flexible isolation beams can enable tolerance of large displacements with very little resistance. Accordingly, any stress or distortion to the LCC package, due to either CTE mismatch or external stress, may be absorbed by the isolator and not transmitted to the disc resonator. As previously discussed, beam rigidity is designed to provide attenuation to vibration of particular frequency range.

The built in heaters and temperature sensors allow active temperature control within the LCC package. This provides advantages including active control that further minimizes the effect of external temperature excursions, proximity of the heaters and sensors to the DRG die minimizes thermal gradient and lag, and using micro-fabricated small heaters (e.g. as described in FIGS. 6A to 6O) consume very little power.

Figure 10D:
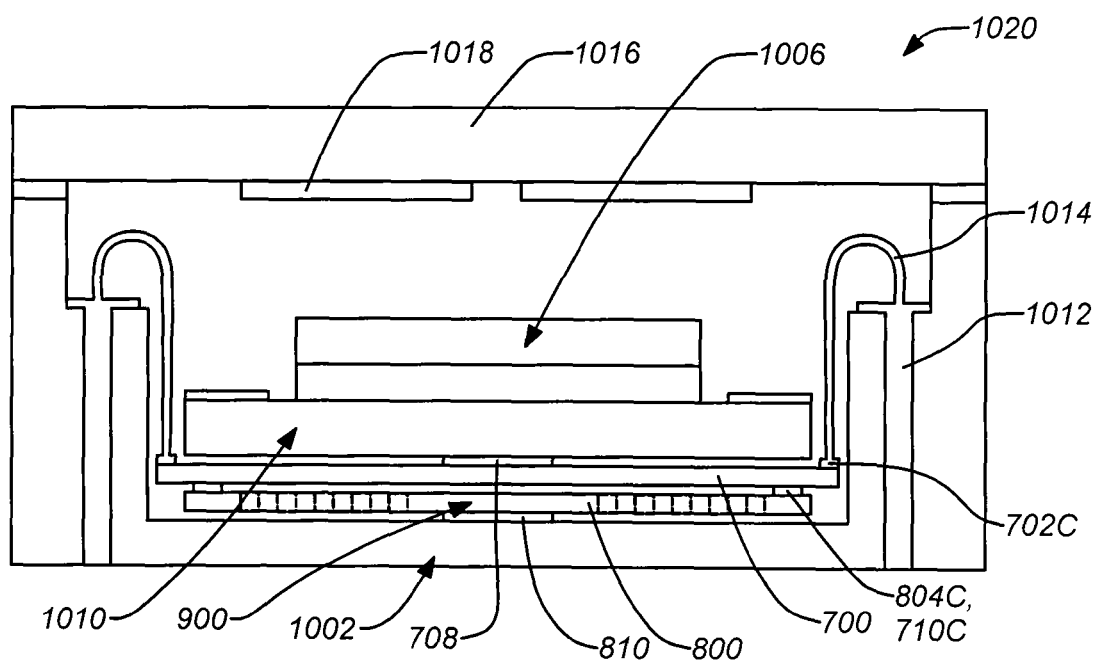
FIG. 10D illustrates another example isolator applied to a disc resonator die having the structural differences of the isolator employed as in FIGS. 7A to 9B.

FIG. 10D illustrates another DRG 1020 embodiment. This DRG 1020 is assembled in essentially the same process described above for the DRG 1000 of FIGS. 10A to 10C. There are only some structural differences in the isolator 900 employed as described in FIGS. 7A to 9B. As previously described, for this isolator 900 the bonds 708, 810 to the MEMS die and the vacuum package are at the central regions of the respective layers 700, 800 as shown, whereas the bonds 804C, 710C between the layers 700, 800 are located at the periphery of each layer 700, 800 (at the outer frame 808 of the bottom layer 800). In addition, this isolator 900 employs no isolation beams on the top layer. However, these structural differences do not alter the general assembly process previously described as will be understood by those skilled in the art.

As described in the previous section, in some embodiments a control ASIC may be located with the MEMS die, e.g. mounted under a baseplate for the disc resonator, such that a temperature sensor is provided by the ASIC. The control ASIC may be used for both heater control and gyro close-loop control. This variant requires some structural changes described hereafter by modifying the top layer of the isolator described in FIGS. 7A to 9B. Those skilled in the art will appreciate that employing a control ASIC on the MEMS die that includes a temperature sensor may also be applied to the example isolator of FIGS. 2A to 4B. In this case, the temperature sensors of the top layer 200 are eliminated along with the four wire bond support beams 216 and pads 218 as the heater connections are instead passed to the baseplate of the semiconductor die at the bond pads 204 applying the principle of the example top layer of FIGS. 10E & 10F.

Figure 10E:
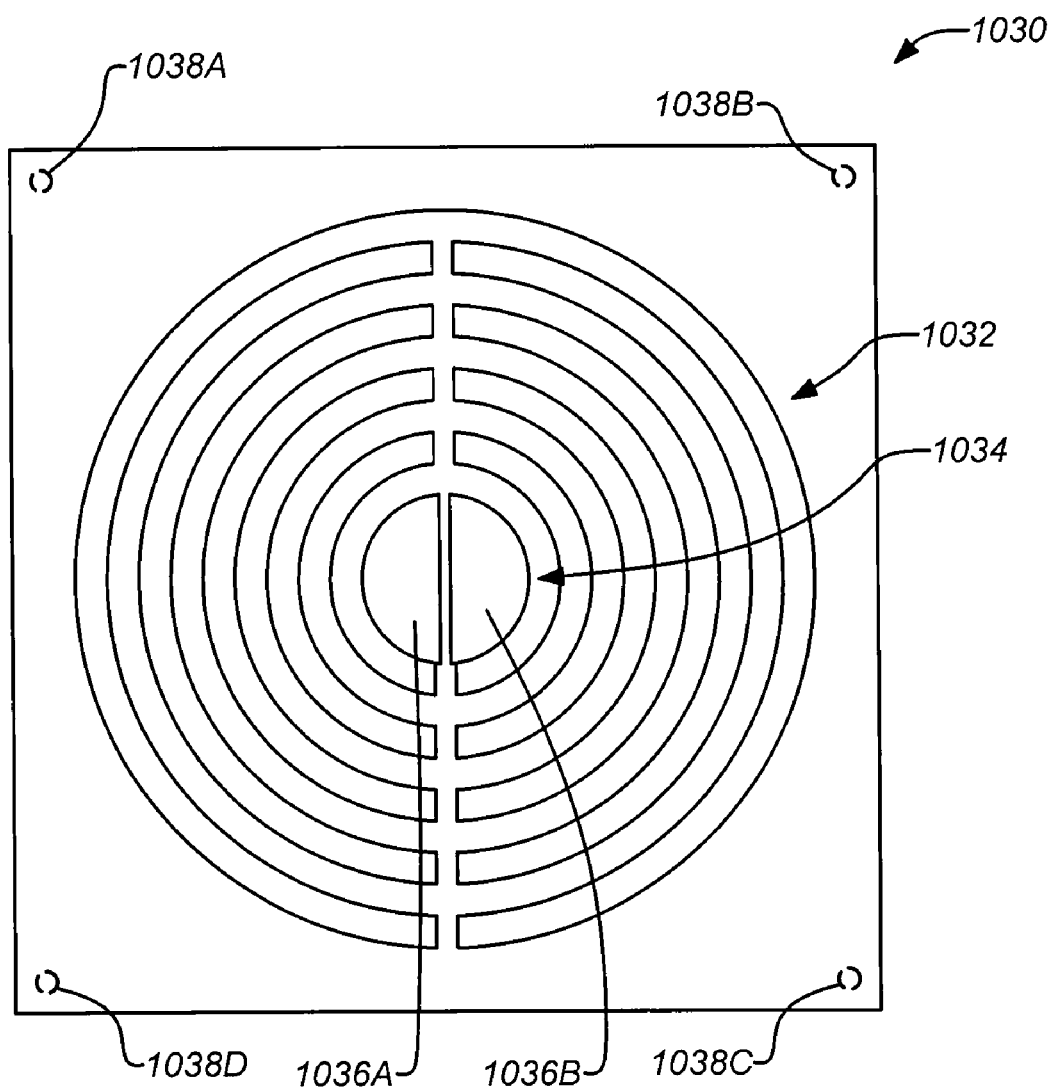
FIGS. 10E & 10F show a layout (top and side views, respectively) of an alternate exemplary top layer that may be employed with the bottom layer of FIGS. 8A & 8B in an isolator for a MEMS die.
Figure 10F:
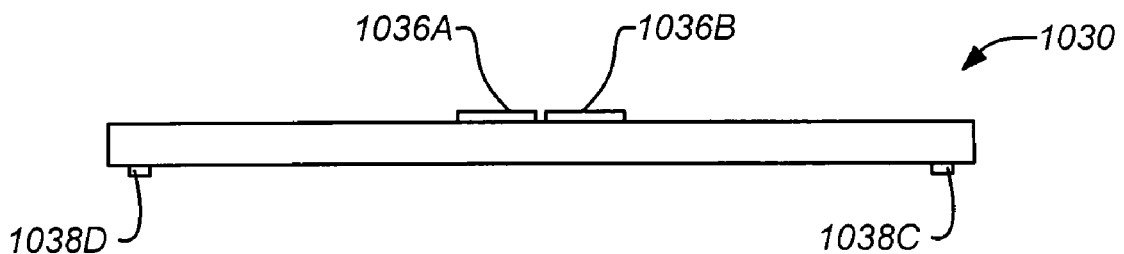

FIGS. 10E & 10F show a layout (top and side views, respectively) of an alternate exemplary top layer 1030 that may be employed with the bottom layer of FIGS. 8A & 8B in an isolator for a MEMS die (or adapted and applied to the isolator of FIGS. 2A to 4B). In this case, electrical connection for the resistive heater element 1032 is carried through a central bond pad 1034 which is divided into electrically separate bond pads 1036A, 1036B. It should be noted that although only two pads 1036A, 1036B are shown for two electrical connection, any number of separate electrical connections may be employed for multiple heater elements as desired. Here also, the resistive heater element 1032 comprises a pattern of interconnected circumferential segments arranged such that a trace is evenly distributed over a large area of the top layer 1030. Those skilled in the art will appreciate that many alternate suitable patterns for the resistive heater element 1032 may be formed depending upon the overall thermal design for the isolator. As before, the central bond pad 1034 is bonded to the MEMS die at assembly. On the lower surface four smaller bond pads 1038A-1038D are disposed, one at each corner of periphery of the layer 1030. These bond pads 1038A-1038D are used to bond to the lower layer 800 previously described.

Figure 10G:
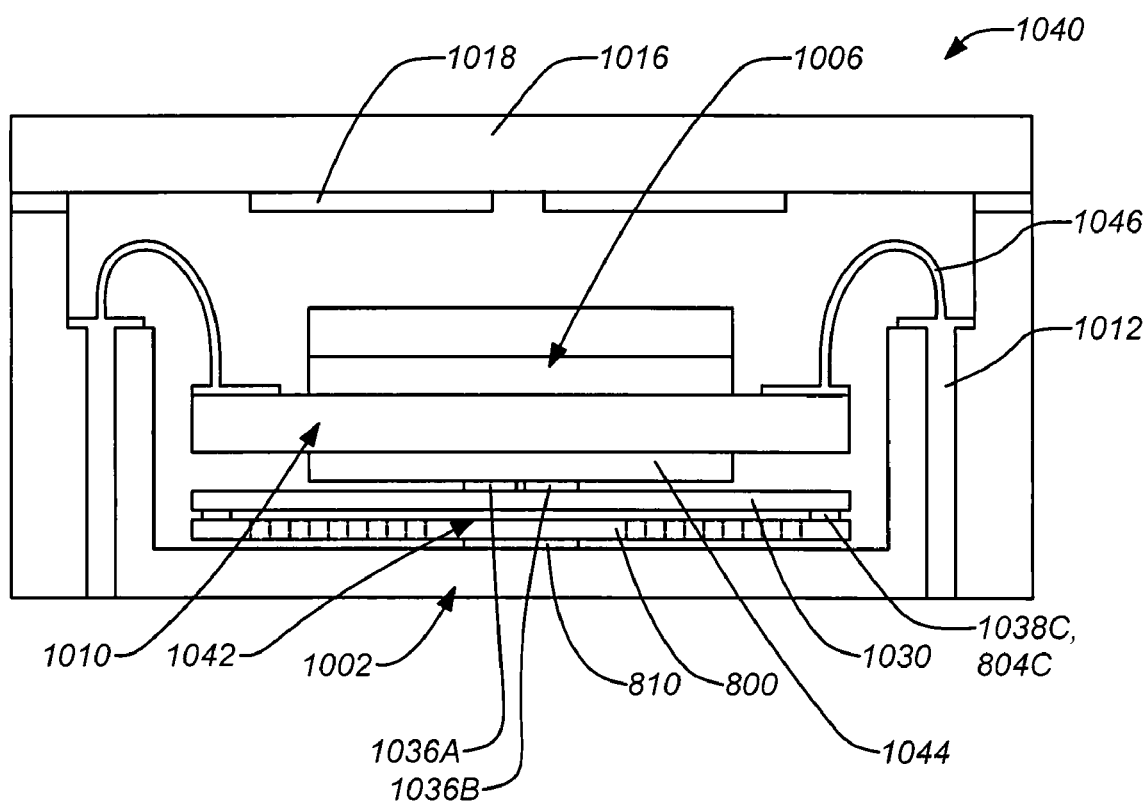
FIG. 10G illustrates an example isolator applied to a disc resonator die having the structural differences of an isolator employed with a top layer of FIGS. 10E & 10F and a bottom layer of FIGS. 8A & 8B.

FIG. 10G illustrates an example isolator applied to a disc resonator die having the structural differences of an isolator employed with a top layer of FIGS. 10E & 10F and a bottom layer of FIGS. 8A & 8B to yield another example DRG 1040. This DRG 1040 is assembled in essentially the same process described above for the DRG 1000 of FIGS. 10A to 10C and the DRG 1020 of FIG. 10D. This isolator 1042 employs the central bond pad 1034 that comprises two separate bond pads 1036A, 1036B to provide the electrical connections of the resistive heater element 1032 of the top layer 1030 to the control ASIC 1044 which is attached to the bottom of the baseplate 1010 of the semiconductor die 1006. In this case, the vacuum package 1002 includes electrical feedthroughs 1012 coupled to wire bonds 1046 which are coupled in turn to the electrical traces at wire bond pads on the top side of the baseplate 1010 of the semiconductor die 1006 rather than the top layer as with previous embodiments. The wire bond pads on the top side of the baseplate may be used to power and interface with the ASIC, which provides control and reading of both the gyro and heater temperature.

As previously discussed, the control ASIC may include the one or more temperature sensors used to regulate the heater, or a stable clock signal employed as a frequency reference. Thus, temperature sensors are not required on the layer 1030. The control ASIC may be any known integrated circuit device for controlling operation of the MEMS device on the semiconductor die, e.g. a disc resonator gyroscope, as will be understood by those skilled in the art. One advantage afforded by this DRG 1040 is that the drift in the electronics is minimized because the ASIC is collocated with the gyro and isolated by the platform.

It should be noted that the figures illustrating processing of the layers and assembly are intended to show only the operations of an exemplary detailed manufacturing process. The relative thicknesses of the various applied layers are not shown to scale as will be appreciated by those skilled in the art.

5. Method of Producing an Isolator for a MEMS Die

Figure 11:
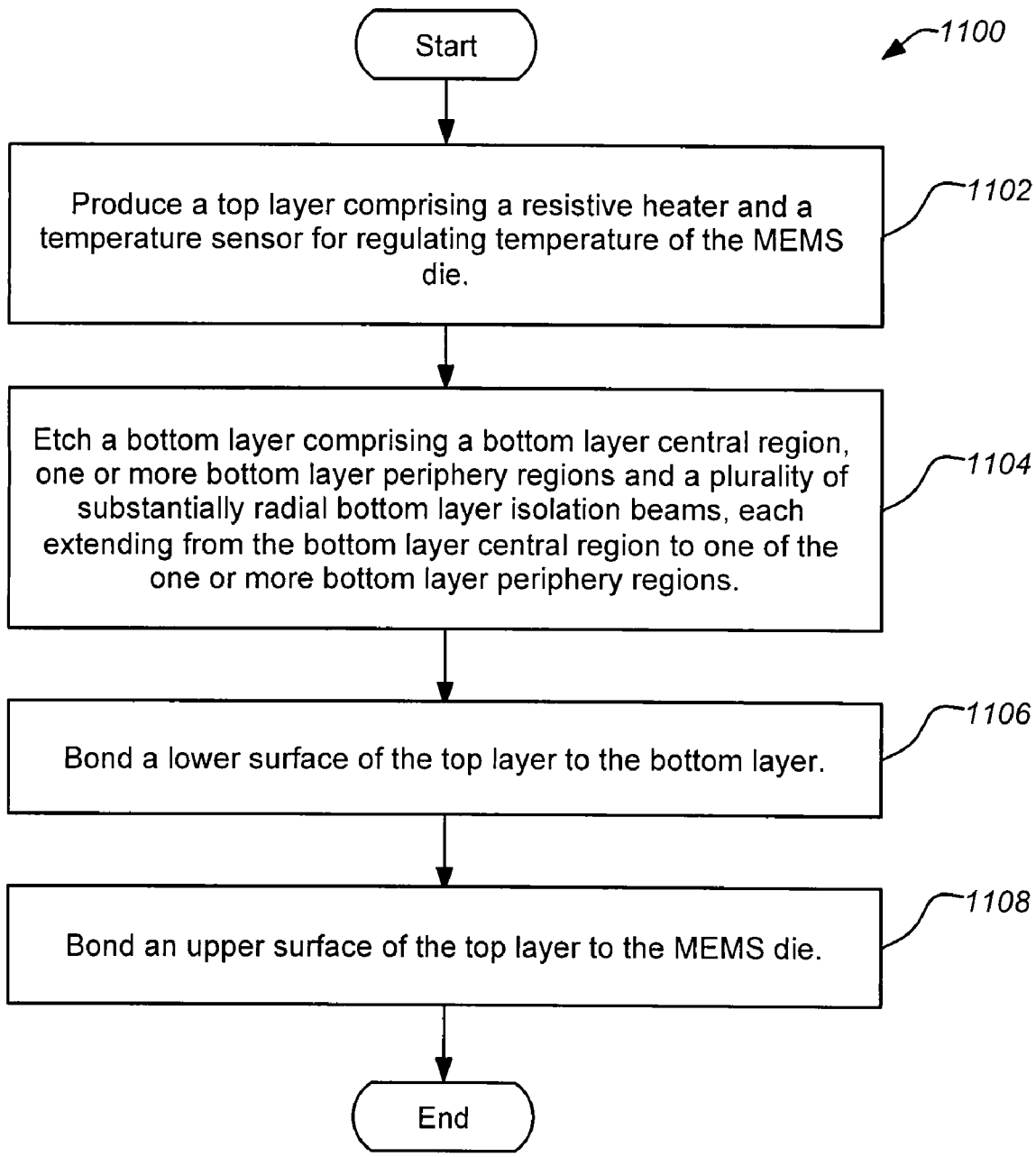
FIG. 11 is a flowchart of an exemplary method of producing an isolator embodiment of the disclosure.

FIG. 11 is a flowchart of an exemplary method 1100 for producing an isolator for a MEMS die. The method 1100 includes an operation 1102 of producing a top layer comprising a resistive heater and a temperature sensor for regulating temperature of the MEMS die. Next in operation 1104, a bottom layer is etched comprising a bottom layer central region, one or more bottom layer periphery regions and a plurality of substantially radial bottom layer isolation beams, each extending from the bottom layer central region to one of the one or more bottom layer periphery regions. In operation 1106 a lower surface of the top layer is bonded to the bottom layer. Finally in operation 1108, an upper surface of the top layer is bonded to the MEMS die. The method 1100 may be further enhanced through optional operations in order to develop the apparatus embodiments described in the foregoing sections.

For example, optionally the top layer may also be etched to comprise a plurality of upper layer isolation beams, each extending from an top layer central region to one of one or more top layer periphery regions. Bonding between the top and bottom layers may occur either at the one or more periphery regions (e.g. an outer frame) or at central regions of the layers. Similarly, bonding of the top layer to the MEMS die and bottom layer to the vacuum package may also occur either at the one or more periphery regions (e.g. an outer frame) or at central regions of the layers, typically bonded conversely to the location of the bond between the layers. In one notable embodiment, the MEMS die may comprise a disc resonator die.

This concludes the description including the preferred embodiments of the present invention. The foregoing description including the preferred embodiments of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. A method of producing an isolator for a MEMS die, comprising,
producing a top layer comprising a resistive heater for regulating temperature of the MEMS die;
etching a bottom layer comprising a bottom layer central region, one or more bottom layer periphery regions and a plurality of substantially radial bottom layer isolation beams, each extending from the bottom layer central region to one of the one or more bottom layer periphery regions;
bonding a lower surface of the top layer to the bottom layer; and
bonding an upper surface of the top layer to the MEMS die; wherein a temperature sensor is used with the resistive heater to regulate the temperature of the MEMS die.

2. The method of claim 1, wherein the temperature sensor comprises a frequency difference between a stable clock frequency and a resonant frequency of the MEMS die and regulating the temperature of the MEMS die is performed by operating the resistive heater such that the frequency difference is maintained at a substantially constant value.

3. The method of claim 1, wherein the top layer is produced comprising the temperature sensor.

4. The method of claim 1, wherein the top layer and the bottom layer are bonded at one or more top layer periphery regions and the one or more bottom layer periphery regions.

5. The method of claim 4, wherein the one or more bottom layer periphery regions comprise a bottom layer outer frame.

6. The method of claim 5, wherein bonding the lower surface of the top layer to the bottom layer comprises bonding the lower surface of the top layer to the bottom layer outer frame.

7. The method of claim 1, further comprising etching the top layer to form a top layer central region, one or more top layer periphery regions, and a plurality of substantially radial top layer isolation beams, each extending from the top layer central region to one of the one or more top layer periphery regions.

8. The method of claim 7, wherein the lower surface of the top layer is bonded at the top layer central region to the bottom layer central region.

9. The method of claim 1, wherein the MEMS die comprises a disc resonator having embedded electrostatic electrodes having sidewalls that interact with interior sidewalls of the disc resonator such that vibration modes of the disc resonator are driven and sensed with the embedded electrostatic electrodes to measure motion of the disc resonator; and
a baseplate having a topside bonded to support the disc resonator and having electrical traces coupled from the embedded electrostatic electrodes and to a baseplate periphery;
wherein the baseplate is bonded to the upper surface of the top layer.

10. The method of claim 9, further comprising a vacuum package comprising electrical feedthroughs where the electrical feedthroughs are coupled to wire bonds which are coupled in turn to the electrical traces at the baseplate periphery;
wherein the bottom layer is bonded to a bottom interior of the vacuum package.

11. The method of claim 10, wherein the vacuum package comprises a lid including a getter material activated to assist producing a vacuum within the vacuum package and the lid is bonded to close out the vacuum package.

12. The method of claim 1, wherein each of the plurality of substantially radial bottom layer isolation beams comprises a plurality of circumferential segments and radial segments connected in series.

13. The method of claim 1, wherein the top layer and the bottom layer comprise a semiconductor material selected from the group consisting of oxidized silicon and fused silica.

14. An apparatus for isolating a MEMS die, comprising:
a top layer comprising a temperature isolation means for substantially actively regulating a temperature of the MEMS die; and
a bottom layer comprising mechanical isolation means for substantially isolating vibration of the MEMS die;
wherein an upper surface of the top layer is bonded to the MEMS die and a lower surface of the top layer is bonded to the bottom layer.

15. The disc resonator gyroscope of claim 14, wherein the MEMS die comprises a disc resonator die.

16. An apparatus for isolating a MEMS die, comprising:
a top layer comprising a resistive heater for regulating temperature of the MEMS die; and
a bottom layer comprising a bottom layer central region, one or more bottom layer periphery regions and a plurality of substantially radial bottom layer isolation beams, each extending from the bottom layer central region to one of the one or more bottom layer periphery regions;
wherein an upper surface of the top layer is bonded to the MEMS die and a lower surface of the top layer is bonded to the bottom layer and a temperature sensor is used with the resistive heater to regulate the temperature of the MEMS die.

17. The apparatus of claim 16, wherein the temperature sensor comprises a frequency difference between a stable clock frequency and a resonant frequency of the MEMS die and regulating the temperature of the MEMS die is performed by operating the resistive heater such that the frequency difference is maintained at a substantially constant value.

18. The apparatus of claim 16, wherein the temperature sensor is disposed on the top layer.

19. The apparatus of claim 16, wherein the top layer and the bottom layer are bonded at one or more top layer periphery regions and the one or more bottom layer periphery regions.

20. The apparatus of claim 19, wherein the one or more bottom layer periphery regions comprise a bottom layer outer frame.

21. The apparatus of claim 20, wherein the lower surface of the top layer is bonded to the bottom layer outer frame.

22. The apparatus of claim 16, wherein the top layer further comprises a top layer central region, one or more top layer periphery regions, and a plurality of substantially radial top layer isolation beams, each extending from the top layer central region to one of the one or more top layer periphery regions.

23. The apparatus of claim 22, wherein the lower surface of the top layer is bonded at the top layer central region to the bottom layer central region.

24. The apparatus of claim 16, wherein the MEMS die comprises a disc resonator having embedded electrostatic electrodes having sidewalls that interact with interior sidewalls of the disc resonator such that vibration modes of the disc resonator are driven and sensed with the embedded electrostatic electrodes to measure motion of the disc resonator; and a baseplate having a topside bonded to support the disc resonator and having electrical traces coupled from the embedded electrostatic electrodes and to a baseplate periphery;

wherein the baseplate is bonded to the upper surface of the top layer.

25. The apparatus of claim 24, further comprising a vacuum package comprising electrical feedthroughs where the electrical feedthroughs are coupled to wire bonds which are coupled in turn to the electrical traces at the baseplate periphery;

wherein the bottom layer is bonded to a bottom interior of the vacuum package.

26. The apparatus of claim 25, wherein the vacuum package comprises a lid including a getter material activated to assist producing a vacuum within the vacuum package and the lid is bonded to close out the vacuum package.

27. The apparatus of claim 16, wherein each of the plurality of substantially radial bottom layer isolation beams comprises a plurality of circumferential segments and radial segments connected in series.

28. The apparatus of claim 16, wherein the top layer and the bottom layer comprise a semiconductor material selected from the group consisting of oxidized silicon and fused silica.

\* \* \* \* \*